US012262543B1

(12) United States Patent
Guhabiswas et al.

(10) Patent No.: US 12,262,543 B1
(45) Date of Patent: Mar. 25, 2025

(54) HIGH DENSITY FERROELECTRIC RANDOM ACCESS MEMORY (FeRAM) DEVICES AND METHODS OF FABRICATION

(71) Applicant: Kepler Computing Inc., San Francisco, CA (US)

(72) Inventors: Debraj Guhabiswas, Berkeley, CA (US); Maria Isabel Perez, Berkeley, CA (US); Jason Y. Wu, Albany, CA (US); James David Clarkson, El Sobrante, CA (US); Gabriel Antonio Paulius Velarde, San Leandro, CA (US); Niloy Mukherjee, San Ramon, CA (US); Noriyuki Sato, Palo Alto, CA (US); Amrita Mathuriya, Portland, OR (US); Saskikanth Manipatruni, Portland, OR (US); Ramamoorthy Ramesh, Moraga, CA (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 18/450,499

(22) Filed: Aug. 16, 2023

Related U.S. Application Data

(63) Continuation of application No. 17/396,609, filed on Aug. 6, 2021, now Pat. No. 11,832,451.

(51) Int. Cl.
*H01L 21/00* (2006.01)
*H01L 49/02* (2006.01)
*H10B 53/30* (2023.01)

(52) U.S. Cl.
CPC .............. *H10B 53/30* (2023.02); *H01L 28/55* (2013.01); *H01L 28/60* (2013.01); *H01L 28/65* (2013.01); *H01L 28/75* (2013.01)

(58) Field of Classification Search
CPC ......... H10B 53/30; H01L 28/55; H01L 28/60; H01L 28/65; H01L 28/75
See application file for complete search history.

(56) References Cited

U.S. PATENT DOCUMENTS 5,471,363 A * 11/1995 Mihara ................... H01L 28/55
361/321.1
5,739,563 A 4/1998 Kawakubo et al.
(Continued)

FOREIGN PATENT DOCUMENTS

DE 102015015854 A1 6/2017
JP 2006352005 A 12/2006
(Continued)

OTHER PUBLICATIONS

U.S. Appl. No. 17/396,609, filed Aug. 6, 2021, Debraj Guhabiswas.
(Continued)

*Primary Examiner* — Richard A Booth
(74) *Attorney, Agent, or Firm* — MUGHAL GAUDRY & FRANKLIN PC

(57) ABSTRACT

Non lead-based perovskite ferroelectric devices for high density memory and logic applications and methods of fabrication are described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate.

20 Claims, 14 Drawing Sheets

(56) References Cited

U.S. PATENT DOCUMENTS

| | | |
|---|---|---|
| 6,165,864 A | 12/2000 | Shen et al. |
| 6,177,351 B1 | 1/2001 | Beratan et al. |
| 6,211,035 B1 | 4/2001 | Moise et al. |
| 6,365,927 B1 | 4/2002 | Cuchiaro et al. |
| 6,368,910 B1 | 4/2002 | Sheu et al. |
| 6,548,343 B1 | 4/2003 | Summerfelt et al. |
| 6,613,586 B2 | 9/2003 | Bailey |
| 6,699,725 B2 | 3/2004 | Lee |
| 6,753,193 B2 | 6/2004 | Kim |
| 7,075,134 B2 | 7/2006 | Araujo et al. |
| 7,754,501 B2 | 7/2010 | Urushido |
| 7,977,720 B2 | 7/2011 | Fukada |
| 8,440,508 B2 | 5/2013 | Udayakumar et al. |
| 8,916,872 B1 | 12/2014 | Tran et al. |
| 9,847,338 B2 | 12/2017 | Nakao |
| 9,875,784 B1 | 1/2018 | Li et al. |
| 10,847,201 B2 | 11/2020 | Manipatruni et al. |
| 11,043,472 B1 | 6/2021 | Dokania et al. |
| 11,063,131 B2 | 7/2021 | Haratipour et al. |
| 11,139,270 B2 | 10/2021 | Manipatruni et al. |
| 11,164,976 B2 | 11/2021 | Ramamoorthy et al. |
| 11,659,714 B1 | 5/2023 | Mukherjee et al. |
| 2001/0013614 A1 | 8/2001 | Joshi et al. |
| 2002/0045279 A1 | 4/2002 | Kwon et al. |
| 2002/0098645 A1 | 7/2002 | Jung et al. |
| 2003/0030084 A1 | 2/2003 | Moise et al. |
| 2005/0020054 A1 | 1/2005 | Hilliger et al. |
| 2006/0133129 A1* | 6/2006 | Rodriguez .............. G11C 11/22 365/145 |
| 2007/0045690 A1 | 3/2007 | Fukada |
| 2008/0057641 A1 | 3/2008 | Wang |
| 2008/0121959 A1 | 5/2008 | Izumi |
| 2008/0197502 A1 | 8/2008 | Kikuchi et al. |
| 2009/0026514 A1 | 1/2009 | Wang |
| 2010/0102404 A1 | 4/2010 | Li et al. |
| 2010/0224961 A1 | 9/2010 | Summerfelt et al. |
| 2010/0320518 A1 | 12/2010 | Ozaki |
| 2011/0062550 A1 | 3/2011 | Udayakumar et al. |
| 2013/0149794 A1 | 6/2013 | Wang |
| 2013/0264620 A1 | 10/2013 | Yu et al. |
| 2020/0051833 A1 | 2/2020 | Chen et al. |
| 2020/0395460 A1 | 12/2020 | Haratipour et al. |
| 2021/0202510 A1 | 7/2021 | Thareja et al. |
| 2021/0202689 A1 | 7/2021 | Thareja et al. |
| 2021/0398991 A1 | 12/2021 | Manfrini et al. |
| 2021/0398992 A1 | 12/2021 | Wu et al. |
| 2022/0376075 A1 | 11/2022 | Manfrini et al. |
| 2022/0399352 A1 | 12/2022 | Leng |
| 2023/0067555 A1 | 3/2023 | Sato et al. |
| 2023/0187476 A1 | 6/2023 | Sato et al. |
| 2023/0189532 A1 | 6/2023 | Müller |

FOREIGN PATENT DOCUMENTS

| | | |
|---|---|---|
| JP | 4428500 B2 | 3/2010 |
| KR | 100481867 B1 | 4/2005 |
| KR | 100601953 B1 | 7/2006 |
| KR | 100791074 B1 | 1/2008 |
| KR | 100901950 B1 | 6/2009 |
| WO | 2004076166 A2 | 9/2004 |

OTHER PUBLICATIONS

U.S. Appl. No. 17/449,750, filed Oct. 1, 2021, Noriyuki Sato.
Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
"Perovskite memory devices with ultra-fast switching speed," News Release Jun. 22, 2021, Pohang University of Science & Technology (Postech), Downloaded on Oct. 19, 2021 from https://www.eurekalert.org/news-releases/603724. (2 pages).
Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.
Desu et al., "Reactive ion etching of ferroelectric SrBi2TaxNb2—xO9 thin films," Appl. Phys. Lett. 68, 566 (1996); https://doi.org/10.1063/1.116402. (3 pages).
Final Office Action notified Apr. 6, 2023 for U.S. Appl. No. 17/396,609.
Final Office Action notified Jul. 19, 2023 for U.S. Appl. No. 17/478,849.
Final Office Action notified Sep. 14, 2023 for U.S. Appl. No. 17/465,792.
First Office Action mailed Nov. 3, 2023 for TW Patent Application No. 111132919 Office Action recalled for typographical errors.
First Office Action mailed Nov. 14, 2023 for TW Patent Application No. 111132919 Office Action issued on Nov. 3, 2023 recalled for typographical errors.
Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).
Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).
Non-Final Office Action notified Apr. 25, 2023 for U.S. Appl. No. 17/478,850.
Non-Final Office Action notified Aug. 3, 2023 for U.S. Appl. No. 17/552,293.
Non-Final Office Action notified Aug. 3, 2023 for U.S. Appl. No. 17/552,323.
Non-Final Office Action notified Aug. 3, 2023 for U.S. Appl. No. 17/552,345.
Non-Final Office Action notified Aug. 15, 2023 for U.S. Appl. No. 17/552,269.
Non-Final Office Action notified Dec. 8, 2022 for U.S. Appl. No. 17/396,609.
Non-Final Office Action notified Dec. 21, 2023 for U.S. Appl. No. 17/465,792.
Non-Final Office Action notified Jul. 20, 2023 for U.S. Appl. No. 17/50,899.
Non-Final Office Action notified Jul. 20, 2023 for U.S. Appl. No. 17/552,266.
Non-Final Office Action notified Jul. 20, 2023 for U.S. Appl. No. 17/552,330.
Non-Final Office Action notified Mar. 31, 2023 for U.S. Appl. No. 17/465,792.
Non-Final Office Action notified Mar. 31, 2023 for U.S. Appl. No. 17/478,849.
Notice of Allowance notified Aug. 7, 2023 for U.S. Appl. No. 17/,85850.
Notice of Allowance notified Aug. 7, 2023 for U.S. Appl. No. 17/553,486.
Notice of Allowance notified Aug. 7, 2023 for U.S. Appl. No. 17/553,496.
Notice of Allowance notified Aug. 10, 2023 for U.S. Appl. No. 17/553,475.
Notice of Allowance notified Aug. 11, 2023 for U.S. Appl. No. 17/478,849.
Notice of Allowance notified Dec. 7, 2023 for U.S. Appl. No. 17/552,330.
Notice of Allowance notified Dec. 12, 2023 for U.S. Appl. No. 17/552,321.
Notice of Allowance notified Dec. 28, 2023 for U.S. Appl. No. 17/552,269.
Notice of Allowance notified Dec. 28, 2023 for U.S. Appl. No. 17/552,293.
Notice of Allowance notified Jul. 3, 2023 for U.S. Appl. No. 17/550,904.
Notice of Allowance notified Jul. 17, 2023 for U.S. Appl. No. 17/553,480.
Notice of Allowance notified Jul. 19, 2023 for U.S. Appl. No. 17/553,508.

(56) References Cited

OTHER PUBLICATIONS

Notice of Allowance notified Jul. 20, 2023 for U.S. Appl. No. 17/553,469.
Notice of Allowance notified Jul. 24, 2023 for U.S. Appl. No. 17/553,472.
Notice of Allowance notified Jul. 26, 2023 for U.S. Appl. No. 17/553,511.
Notice of Allowance notified Jun. 15, 2023 for U.S. Appl. No. 17/396,609.
Notice of Allowance notified Nov. 13, 2023 for U.S. Appl. No. 17/465,796.
Notice of Allowance notified Nov. 22, 2023 for U.S. Appl. No. 17/550,899.
Notice of Allowance notified Nov. 29, 2023 for U.S. Appl. No. 17/552,266.
Office Action—Written Primary Examination Decision—notified Jan. 10, 2024 for Taiwan Patent Application No. 111132920.
Office Action notified May 16, 2023 for Taiwan Patent Application No. 111132920.
Restriction Requirement notified Apr. 26, 2023 for U.S. Appl. No. 17/550,899.
Restriction Requirement notified Apr. 26, 2023 for U.S. Appl. No. 17/552,266.
Restriction Requirement notified Apr. 26, 2023 for U.S. Appl. No. 17/552,321.
Restriction Requirement notified Aug. 22, 2022 for U.S. Appl. No. 17/396,609.
Restriction Requirement notified Dec. 30, 2022 for U.S. Appl. No. 17/465,92.
Restriction Requirement notified Jan. 11, 2023 for U.S. Appl. No. 17/478,849.
Restriction Requirement notified Jul. 13, 2023 for U.S. Appl. No. 17/552,269.
Restriction Requirement notified May 1, 2023 for U.S. Appl. No. 17/552,330.
Restriction Requirement notified May 1, 2023 for U.S. Appl. No. 17/552,345.
Restriction Requirement notified Sep. 14, 2023 for U.S. Appl. No. 17/465,796.
Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).
Shi et al., "Reactive ion etching of sol-gel-derived BST thin film," Ceramics International vol. 30, Iss. 7, 2004, pp. 1513-1516. (4 pages).
Ueda et al., "Plasma etching of PZT capacitor using ISM plasma source for ferroelectric memory application," Integrated Ferroelectrics, 39:1-4, 23-30, DOI: 10.1080/10584580108011924. (8 pages).
Walters, "Scaling and Design of Thin Film Ferroelectric Hafnium Oxide for Memory and Logic Devices," Dissertation for PhD Philosophy, University of Florida, 2020 (170 pages).
Wang et al., "Ferroelectric Devices and Circuits for Neuro-Inspired Computing," MRS Communications (2020), 10, 538-548, doi: 10.1557/mrc.2020.71, (11 pages).
Yeh et al., "Fabrication and Investigation of Three-Dimensional Ferroelectric Capacitors for the Application of FeRAM," AIP Advances, 6 035128(2016); doi: 10.1063/1.4945405. 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

\* cited by examiner

HIGH DENSITY FERROELECTRIC RANDOM ACCESS MEMORY (FeRAM) DEVICES AND METHODS OF FABRICATION

CLAIM FOR PRIORITY

This application is a continuation of, and claims the benefit of priority to, U.S. patent application Ser. No. 17/396,609, filed on Aug. 6, 2021, and now issued as U.S. Pat. No. 11,832,451 on Nov. 28, 2023, and titled "HIGH DENSITY FERROELECTRIC RANDOM ACCESS MEMORY (FERAM) DEVICES AND METHODS OF FABRICATION," and which is incorporated by reference in its entirety.

BACKGROUND

Ferroelectric Random Access Memory (FeRAM) devices include materials that difficult to etch. Ion beam etch of a stack including ferroelectric materials has been carried out, but the process has resulted in substantially non-vertical profiles and etch residue that causes devices degradation. As such alternate methods to pattern ferroelectric materials is essential to realize high density array is essential.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DETAILED DESCRIPTION

Figure 1:
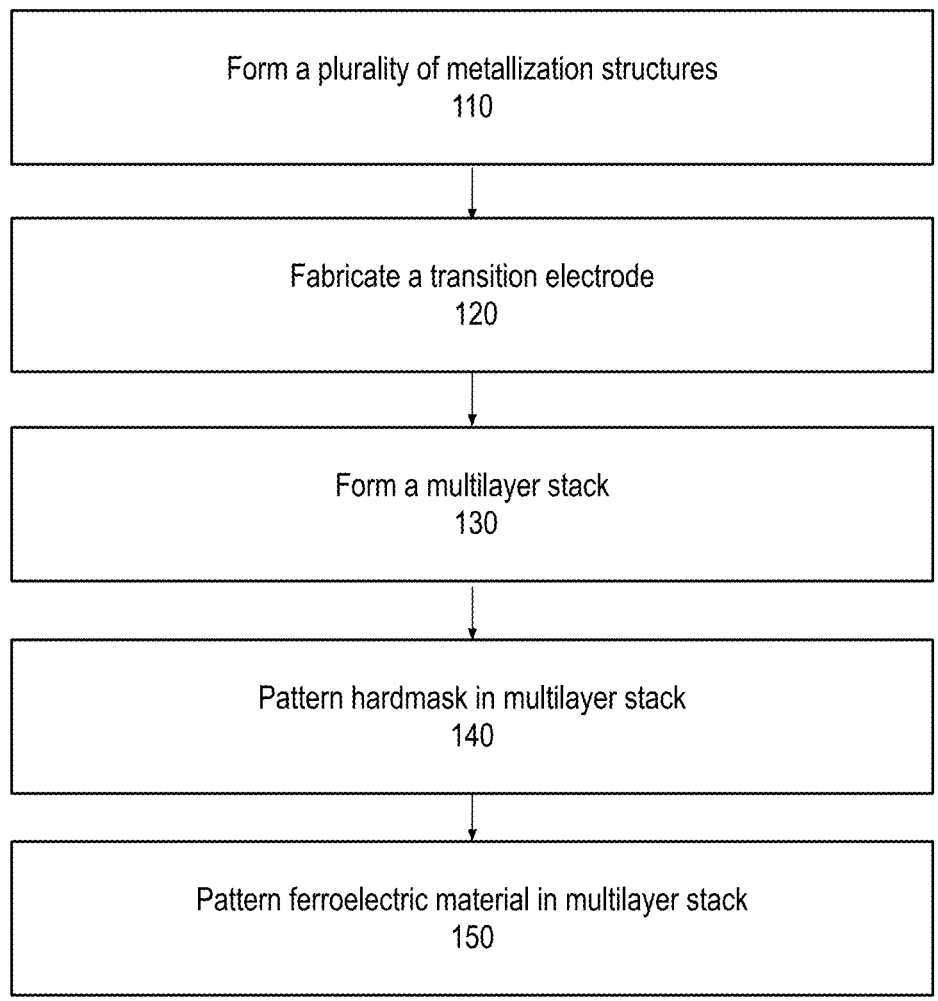
FIG. 1 is a flow diagram of a method to fabricate a ferroelectric memory device, in accordance with an embodiment of the present disclosure.

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

Non lead-based perovskite ferroelectric devices for high density memory and logic applications and methods of fabrication are described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment, is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment, may be combined with a second embodiment, anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Perovskite FeRAM devices are advantageous for high density memory applications owing to their low power consumption and high on/off ratio. Perovskite FeRAM device are also desirable over other forms of memory such as magnetic tunnel junction-based devices due to the relatively low number of layers needed. A typical FeRAM may be fully operational with three layers, where a ferroelectric dielectric is contained between two electrode layers. The electrode layers may also include Perovskite materials to enable lattice matching and reduction in electrical resistance. Introduction of lead-free Perovskite materials offer additional environmental benefits without sacrificing device performance.

Patterning of Perovskite materials presents many challenges due to the low volatility of many of etch by-products. Accumulation of etch by-products on sidewalls of patterned structures often leads to non-functional devices. For this reason, patterning techniques often include ion beam milling to sputter the materials to fabricate isolated devices. Ion beam milling often includes low angle (relative to a normal of a device surface) sputter etching followed by high angle cleaning. However, accumulation of milling residue can be more than 20 nm requiring nonuniform and long cleanup times resulting in sidewall damage.

Ion beam milling can also be self-limiting in high density applications where height of individual devices and close proximity between adjacent devices (spacing) can create shadowing effects. Typical height to spacing ratio for high density devices less than 2.5:1. Other problems with ion beam milling alone include lack of selectivity to a masking material implemented. Often the masking material is removed faster than the Perovskite materials leading to mask erosion, erosion of top electrode of a FeRAM device and sloped sidewalls. Sloped sidewalls that exceed 45 degrees, for example, can limit a density of FeRAM devices in a given area.

To enable high density FeRAM devices the inventors have resorted to non lead-based Perovskite materials owing its environmental friendliness for mass production. Patterning of FeRAM devices is enabled by reactive ion etching techniques that utilize feedstock gases such as Ar, $N_2$, $O_2$, HBr or $CH_4$ in addition to other chemistries when combined in specific proportions can lead to residue free sidewall surfaces of a patterned FeRAM device. Plasma based approach also provides other benefits that include enabling patterning to form devices have greater than 5:1 aspect ratio between height and spacing. A higher aspect ratio can enable implementation of thicker masking materials.

FIG. 1 is a flow diagram of a method 100 to fabricate a plurality of FeRAM devices, in accordance with an embodiment of the present disclosure. The method 100 begins at operation 110 by forming a plurality of metallization structures above a substrate. The method 100 continues at operation 120 with the process to fabricate a transition electrode above each metallization structure. The method 100 continues at operation 130 with the process to deposit a material layer stack for the formation of a FeRAM device above a respective metallization structure in the plurality of metallization structures. The method 100 continues at operation 140 by patterning a hardmask layer within the material layer stack. The method 100 continues at operation 150 by patterning the ferroelectric materials within the material layer stack.

Figure 2A:
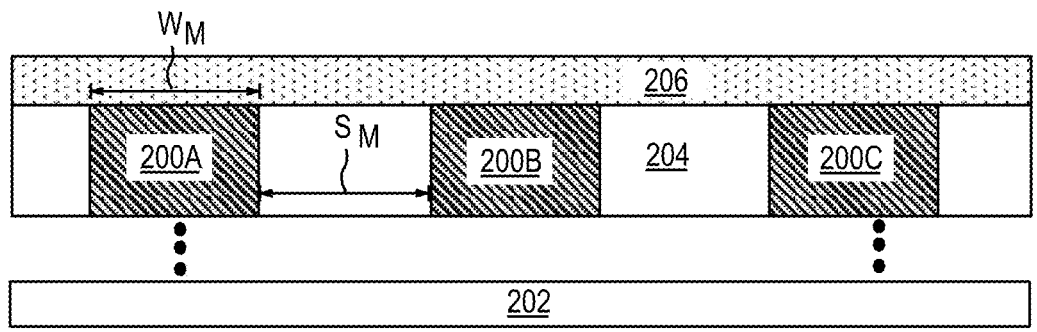
FIG. 2A is a cross-sectional illustration of a plurality of metallization structures formed above a substrate.

FIG. 2A is a cross-sectional illustration of a plurality of metallization structures 200 formed above a substrate 202. Metallization structures 200 are formed within a dielectric 204 In the illustrative embodiment, three metallization structures 200A, 200B and 200C are shown. In exemplary embodiments, there may be one or more levels of logic transistors and interconnects between the metallization structures 200 and the substrate 202. In high density memory applications, the number of metallization structures can range between 1K and 5K within a given array. The metallization structures 200 have a lateral thickness, $W_M$, that may be determined by a minimum acceptable electrical resistance. In some embodiments, the metallization structures 200 are discrete structures that are substantially circular or elliptical in shape. The metallization structures 200 may have a maximum lateral thickness between 20 nm and 40 nm. For example, the metallization structures 200 may have a lateral thickness between 20 nm and 40 nm, along the x-direction, as shown. In other embodiments, each metallization structure 200A, 200B and 200C is a line that extends into the plane of the Figure As shown metallization structures 200A, 200B and 200C have substantially the same lateral thickness to minimize variability in device performance.

In one or more embodiments, the metallization structures 200 each include copper. In some embodiments, metallization structures 200 include a liner layer and a fill metal on the liner layer. For example, the liner layer may include a material, such as but not limited to, ruthenium, cobalt or tantalum and the fill metal may include copper or tungsten. In an embodiment, each of the metallization structures are separated by spacing $S_M$. $S_M$ is substantially determined by a designed density of FeRAM devices to be fabricated within a given area, as well as by underlying structures embedded within layers below the metallization structures 200.

In an embodiment, an encapsulation layer 206 is deposited on the metallization structures 200 as well as on the dielectric layer 204. The encapsulation layer 206 is deposited to a thickness that is chosen to accommodate a thickness of a transition electrode to be formed on metallization structures 200. In an embodiment, the encapsulation layer 206 also serves as a diffusion barrier layer. A diffusion barrier layer is essential for preventing diffusion of copper from the metallization structures 200 to the FeRAM devices to be formed. As such, the encapsulation layer 206 includes material such as but not limited to silicon and one or more of nitrogen, oxygen, or carbon. In some embodiments, other dielectric materials such as substantially crystalline forms of metal oxides including hafnium, zirconium, niobium or lanthanum may be used to provide a more robust surface while etching to form FeRAM devices.

Figure 2B:
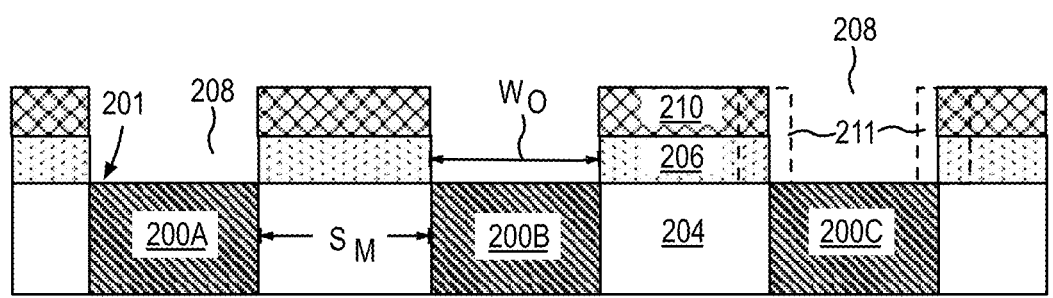
FIG. 2B is a cross-sectional illustration of the structure in FIG. 2C following the process to form openings above the plurality of metallization structures.
Figure 2C:
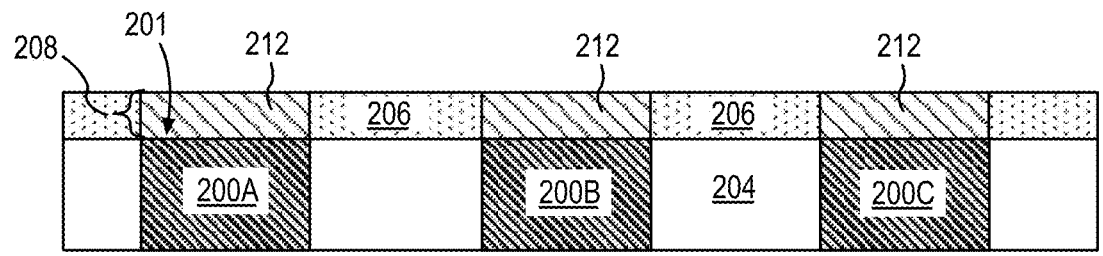
FIG. 2C is a cross-sectional illustration of the structure in FIG. 2B following the process to form a transition electrode above each of the plurality of metallization structures, in accordance with an embodiment of the present disclosure.

FIG. 2B is a cross-sectional illustration of the structure in FIG. 2C following the process to form openings 208 in the encapsulation layer 206 above the plurality of metallization structures 200. In an embodiment, openings 208 are formed in the encapsulation layer as shown. The openings 208 may be formed by patterning a photoresist mask 210 on the encapsulation layer. Photoresist mask 210 be formed by a lithographic technique. The encapsulation layer 206 may be etched by a plasma etch process through openings in the photoresist mask 210. The openings 208 may have a lateral thickness, $W_O$, that is greater than or less than the lateral thickness, $W_M$, as indicated by dashed lines 211. In the illustrative embodiment, the openings 208 have a same lateral thickness as the lateral of the metallization structures 200A, 200B or 200C.

FIG. 2C is a cross-sectional illustration of the structure in FIG. 2B following the process to form a transition electrode 212 above each of the plurality of metallization structures 200, in accordance with an embodiment of the present disclosure. In an embodiment, the photoresist mask is removed, and a conductive layer is deposited in the openings 208 on uppermost surfaces 201 of each of the metallization structures 200A, 200B and 200C and on the encapsulation layer 206. The conductive layer is planarized. The conductive layer may be planarized by a chemical mechanical polish (CMP) process to form a transition electrode 212 above each metallization structure 200A, 200B and 200C. In an embodiment, the CMP process removes the excess conductive layer from above the upper most surface 206A of the encapsulation layer to isolate a transition electrode 212 above each metallization structures 200A, 200B and 200C. In different embodiments, depending on size of openings 208, the transition electrode 212 may be formed above a portion of the plurality of metallization structures 200 or extend above the dielectric 204. In either case, the uppermost surfaces 201 would not be physically exposed to FeRAM devices to be subsequently formed.

Figure 2D:
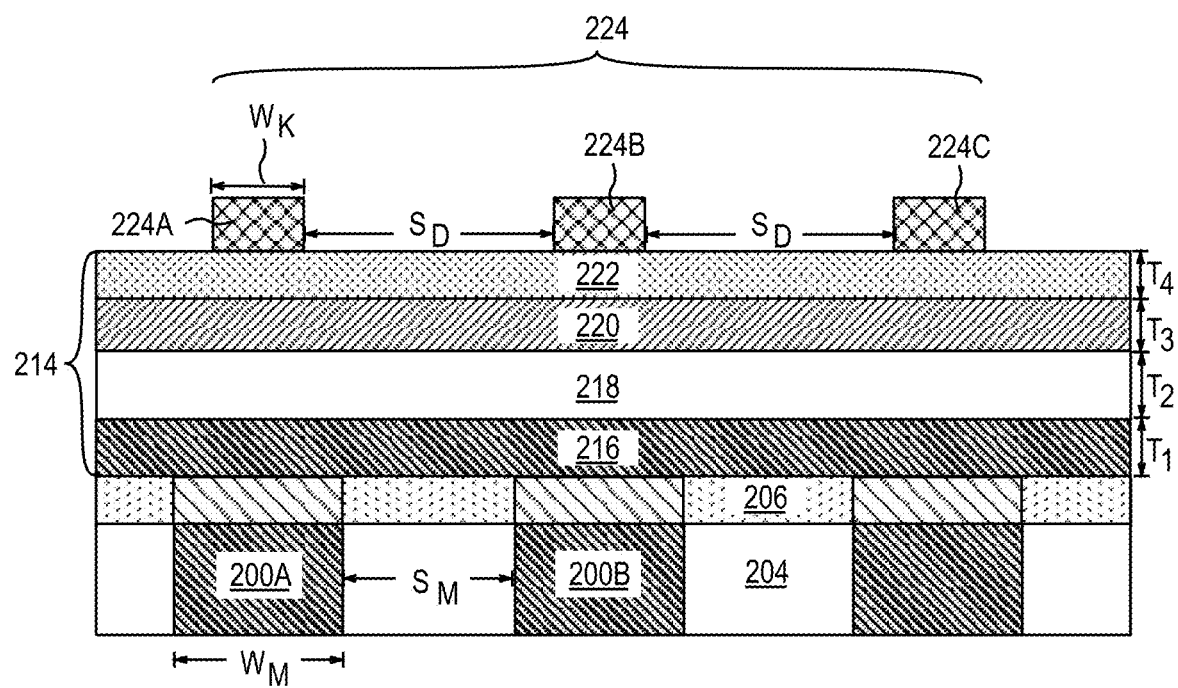
FIG. 2D is a cross-sectional illustration of the structure in FIG. 2C following the process to form a material layer stack on the transition electrode, in accordance with an embodiment of the present disclosure.

FIG. 2D is a cross-sectional illustration of the structure in FIG. 2C following the process to form a material layer stack 214 on the transition electrode 212 and on the encapsulation layer 206, in accordance with an embodiment of the present disclosure. In an exemplary embodiment, all layers of the material layer stack 214 are deposited in situ, i.e., without breaking vacuum. The material layer stack 214 maybe deposited by an atomic layer deposition (ALD) process, a plasma enhanced chemical vapor deposition (PECVD), chemical vapor deposition (CVD) or a physical vapor deposition (PVD) process. In some embodiments, a conductive layer 216 is blanket deposited on the transition electrodes 212 and on the encapsulation layer 206. In an exemplary embodiment, conductive layer 216 includes a conductive ferroelectric oxide. The conductive ferroelectric oxide includes one of a non-Pb perovskite metal oxides, such as but not limited to, La—Sr—CoO3, SrRuO3, La—Sr—MnO3, YBa2Cu3O7, Bi2Sr2CaCu2O8, or LaNiO3.

The conductive layer 216 is deposited to a thickness, $T_1$, that is suitable for minimizing electrical resistance and flare in sidewalls during a patterning process to be utilized to fabricate FeRAM devices. In some embodiments, the conductive layer 216 has a thickness that is between 3 nm and 30 nm. A thickness of less than 30 nm is highly desirable to prevent significant tapering in sidewalls during the patterning process.

The deposition process is continued by deposition of a ferroelectric dielectric layer 218. In an exemplary embodiment the ferroelectric dielectric layer 218 is blanket deposited on the conductive layer 216. The ferroelectric dielectric layer 218 has a thickness, $T_2$, between 1 nm and 30 nm. In some embodiments, ferroelectric dielectric layer 218 include non-Pb Perovskite material in the form $ABO_3$, where A and B are two cations of different sizes and O is Oxygen. A is generally larger than B in size. In some embodiments, non-Pb Perovskites can also be doped, e.g., by La or Lanthanides. The non-Pb Perovskite material can include one or more of La, Sr. Co, Cr, K, Nb, Na, Sr, Ru, Y, Fe, Ba, Hf, Zr, Cu, Ta, Bi, Ca, Ti and Ni.

In other embodiments, ferroelectric dielectric layer 218 include low voltage ferroelectric material sandwiched between the conductive oxide layers (216 and 220). These low voltage FE materials can be of the form $AA'BB'O_3$, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of a conductive layer 220 on the ferroelectric dielectric layer 218. In an exemplary embodiment, the conductive layer 220 includes a material that is the same or substantially the same as the material of the conductive layer 216. When conductive layers 216 and 220 include the same material, the material layer stack is symmetric. In different embodiments, conductive layer 220 can have a different thickness than the conductive layer 216. It is desirable for conductive layer 220 to be as thin as possible to facilitate fabrication. In embodiments, conductive layer 220 is deposited to a thickness, $T_3$, between 3 nm and 30 nm.

The deposition process to form material layer stack 214 concludes with the formation of a hard mask layer 222 on the conductive layer 220. In some embodiment, the hard mask layer 222 is blanket deposited by a PECVD, CVD or PVD process. In an embodiment, the hard mask layer 222 includes a material that has a favorable etch selectivity compared to the ferroelectric materials in the material layer stack 214. In some embodiments, the hard mask layer 222 includes materials that can be patterned with high fidelity with respect to a masking layer formed on the hard mask layer 222, for example SiO2, Si3N4, DLC (Diamond Like Carbon) or Al2O3. In some embodiments, the hardmask layer 222 may include a conductive material that is different from the conductive material of the ferroelectric material. In some embodiments, it is desirable to deposit hard mask layer 222 to a thickness, $T_4$, that enables patterning of at least the conductive layer 220. In other embodiments, hard mask layer 222 may deposited to a thickness, $T_4$, that depends on a total thickness of material layer stack 214. $T_4$ may be at least 20 nm.

In an embodiment, a photoresist mask 224 is formed on the hard mask layer 222 and is formed by a lithographic process. The photoresist mask 224 includes blocks 224A, 224B and 224C. Each block 224A-C is a mask for patterning a discrete FeRAM device. Adjacent blocks, for example, 224A and 224B, and 224B and 224C are separated from each other by a spacing $S_D$. As discussed above, a maximum density of FeRAM devices is determined by $W_M$ and $S_M$. However, a maximum lateral thickness of the FeRAM devices to be formed is determined by $W_K$ and $S_D$. Furthermore, it is to be appreciated that a ratio between the combined sum of thicknesses $T_1$, $T_2$ and $T_3$ and spacing $S_D$ places a limit on the profile or sidewall angles of layers of FeRAM devices to be formed, if the sidewall angle is different from vertical, as will be discussed below.

In general blocks 224A, 224B and 224C have a minimum lateral thickness, $W_K$, that is approximately half the lateral thickness, $W_M$, of the metallization structure 200A, 200B or 200C, respectively. In some embodiments, $W_K$ is less than or equal to $W_M$. In other embodiments, $W_K$ is greater than or equal to $W_M$.

Figure 2E:
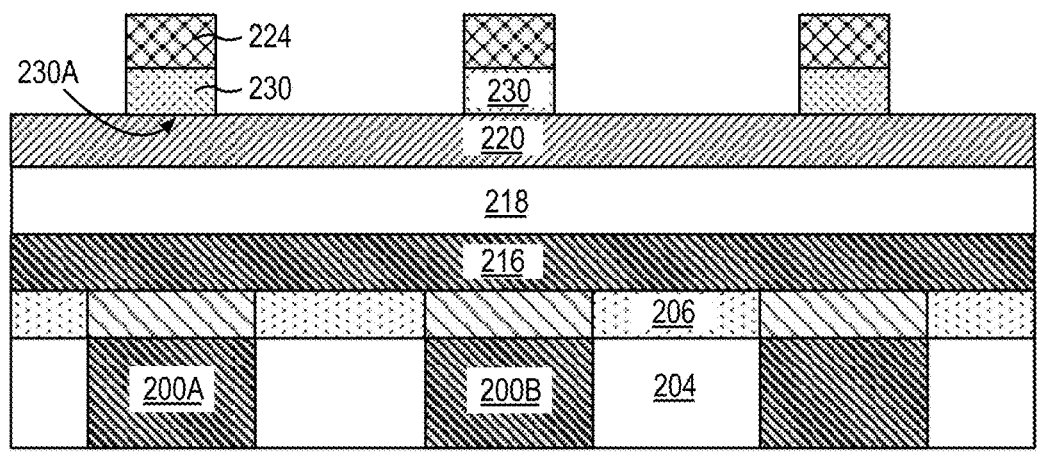
FIG. 2E is a cross-sectional illustration of the structure in FIG. 2D following the process to pattern an uppermost layer in the material layer stack.

FIG. 2E is a cross-sectional illustration of the structure in FIG. 2D following the process to pattern hardmask layer 222. In an embodiment, the hard mask layer 222 is etched by a plasma etch process. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9-1e12 ions/cm$^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations. It is highly desirable to pattern the hard mask layer 222 to have substantially vertical side walls to prevent increase in the lateral thickness when patterning the remaining layers in the material layer stack 214.

A $CH_XF_Y$ (fluorocarbon) $O_2$ and Ar based gas combination may be utilized to etch the hard mask layer 222 to form hardmask 230 in one of the three different plasma discharges described above. In an exemplary embodiment, the hardmask 230 has a substantially vertical profile relative to a lowermost surface 230A. In some embodiments, the photo resist mask 224 is removed after forming the hard mask 230.

Figure 3A:
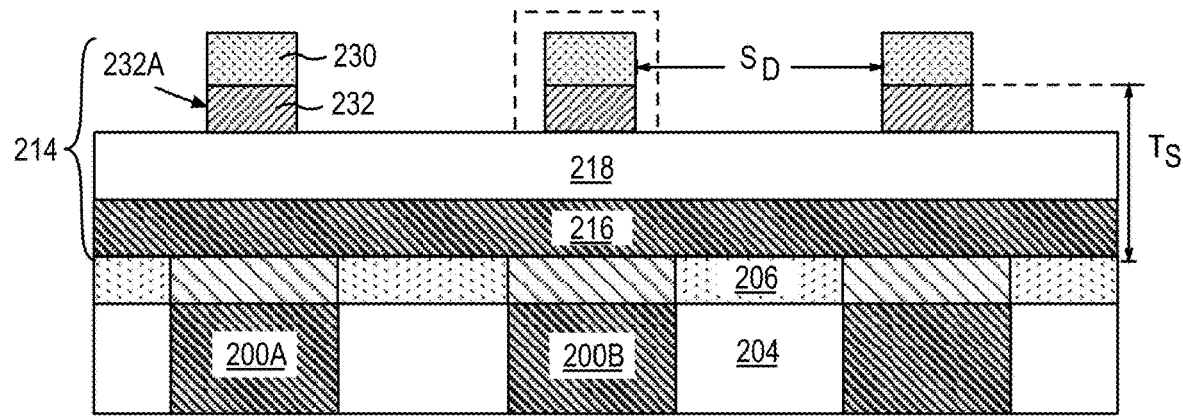
FIG. 3A is a cross-sectional illustration of the structure in FIG. 2E following the process to pattern a top conductive layer in the material layer stack.

FIG. 3A is a cross-sectional illustration of the structure in FIG. 2E following the process to pattern conductive layer 222. The hard mask 230 is utilized to pattern conductive layer 222. In an embodiment, a plasma etch process is utilized to etch the conductive layer 222 to form a top electrode 232. In the illustrative embodiment, the top electrode 232 has substantially vertical sidewalls 232A.

In embodiments, the plasma etch process has a combination of features that is suitable to etch to form top electrode 230 selectively to hardmask 230. In embodiments, the top electrode 230 is etched using a plasma etch process that utilizes a combination of gas chemistry including fluorine, such as for e.g., $CF_4$, $SF_6$, $NF_3$, $CHF_3$ etc, and chlorine, such as for e.g., $BCl_3$, $CH_3Cl$ etc. Other gases such as $O_2$, $CH_4$, $N_2$, Ar, HBr, can also be added to the chemistry either to act as a carrier gas or to aid various chemical pathways for etching. In some embodiments, the plasma etch process utilizes chuck temperatures between 10-60 degrees Celsius while operating at sufficiently low pressure, such as below 1 Pa. In other embodiments, the plasma etch process utilizes chuck temperatures above 60 degrees but less 300 degrees Celsius. A combination of high plasma bias and low plasma bias is utilized the pattern the conductive layer selectively to the hardmask 230.

In other embodiments, the sidewalls 232A are not vertical and have a slope that is different from 90° with respect to a normal to lowermost surface 232B as shown in Figure. In an embodiment, the top electrode 232 is etched to have sidewalls 232A that are sloped, as shown. The slope may be defined by an angle theta$_1$. While it is desirable for theta$_1$ to be substantially close to zero in embodiments, slope can vary between 0 degrees to 30 degrees from a normal relative to lower surface 232B. In exemplary embodiments, the slope is between 0 and 15 degrees. In general, a maximum allowable theta$_1$, i.e., theta$_{1max}$, is set by a ratio, $R_{HS}$, between thickness $T_S$, of the ferroelectric portion of material layer stack 214 and spacing $S_D$. In general, theta$_{1max}$ is inversely proportional to $R_{HS}$. As spacing $S_D$ decreases, the maximum permissible slope is decreased to prevent merging between FeRAM devices (to be formed). As indicated by dotted lines 233, the variation in the slope of sidewall 232A can change the lateral thickness, $W_{TE}$, of lowermost surface 232B.

In some embodiments, the hardmask 230 is eroded during the plasma etch process as shown. In some such embodiments, anywhere between 30% to 50% of the hard mask 230 may be removed during patterning to form top electrode 232, as shown. For example, the resulting hardmask 230 may have a thickness, $T_{41}$, that is 30% to 50% of the as deposited thickness $T_4$.

In some embodiments, erosion of the hardmask 230 is non uniform and the plasma etch process utilized to form top electrode 232 erodes the hardmask 230 to form a hardmask 232 have a rounded top surface 230B. While a rounded hardmask may not impact profile of sidewalls 232A, the sidewalls of layers below top electrode 232 may be affected.

Figure 4A:
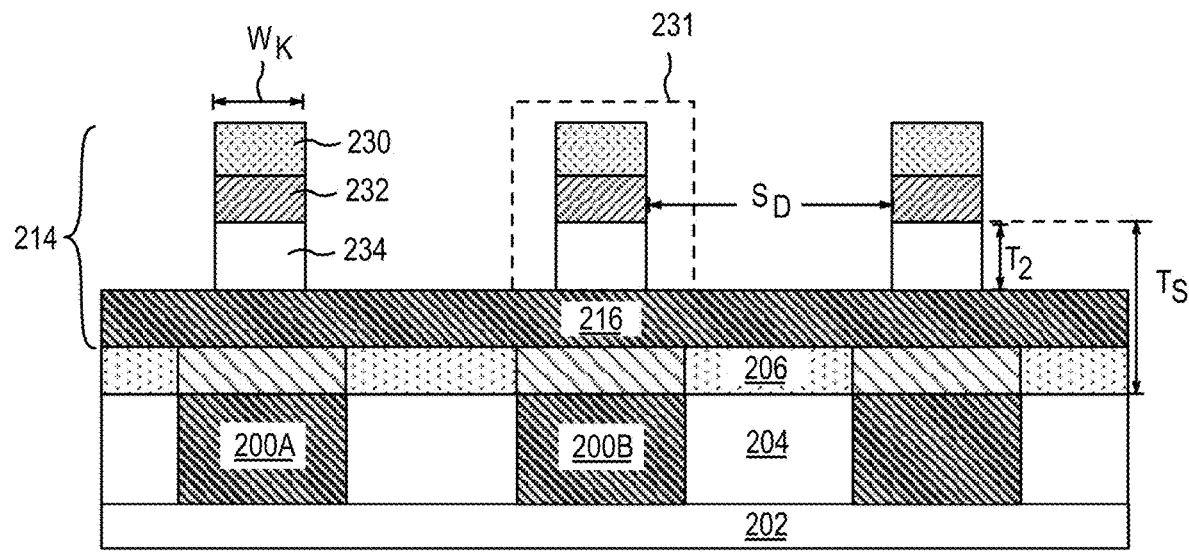
FIG. 4A is a cross-sectional illustration of the structure in FIG. 3A following the process to etch a ferroelectric dielectric layer within the material layer stack.

FIG. 4A is a cross-sectional illustration of the structure in FIG. 3A following the process to etch ferroelectric dielectric layer 218 to form etched ferroelectric dielectric layer 234 (herein ferroelectric dielectric layer 234) within the material layer stack 214. The plasma etch process to pattern ferroelectric dielectric layer 218 may be similar to form top electrode 232. However, ratio of certain gas mixtures may be utilized to etch ferroelectric dielectric layer 218 selective to top electrode 232. For example, gas chemistries utilizing oxygen, carbon or boron in conjunction with a halide species may advantageously etch ferroelectric dielectric layer 234 selective to the top electrode 232 as well as underlying conductive layer 208. In an exemplary embodiment, the sidewalls 234A of the etched ferroelectric dielectric layer 234 are substantially vertical, as shown. In some such exemplary embodiments, the lateral width of the mask, $W_K$ is substantially preserved.

Figure 4B:
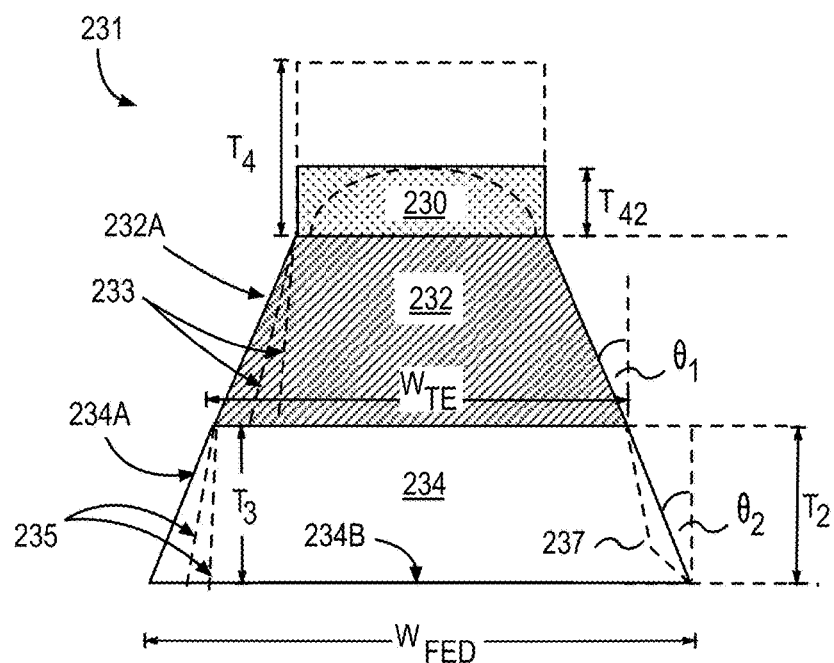
FIG. 4B is a cross-sectional illustration of a patterned portion of the material layer stack.

In other embodiments, the sidewalls 234A of the etched ferroelectric dielectric layer 234 are sloped. FIG. 4B is enhanced cross sectional illustration of a portion 231 of the structure in FIG. 4A and illustrates sloped sidewalls 234A. In embodiments, the slope can vary between 0 degrees to 30 degrees from a normal relative to lower surface 234B. The slope may be defined by an angle theta$_2$.

In general, a maximum allowable theta$_2$, i.e., theta$_{2max}$, is also set by ratio, $R_{HS}$, between thickness $T_S$, of the ferroelectric portion of material layer stack 214 and spacing $S_D$ (as shown in FIG. 4A). In some embodiments, theta$_{2max}$ is dependent on $T_1$, theta$_1$ and thickness, $T_2$, of ferroelectric dielectric layer 234. For example, the thinner the ferroelectric dielectric layer 234 is, the greater theta$_{2max}$ may be (up to 30 degrees). In exemplary embodiments, theta$_{2max}$ is between 0 and 10 degrees when $T_1$ is less than 30 nm and $T_2$ is less than 10 nm. As indicated by dotted lines 235, the variation in the slope of sidewall 234A can change the lateral thickness, $W_{FED}$, of lowermost surface 234B. It is to be appreciated that sidewalls 232A and 234A can have a same or different slopes. In some embodiments, theta$_1$ is substantially the same as theta$_2$ and the sidewalls 232A and 234A are substantially collinear. In some such embodiments, theta$_1$ and theta$_2$ are both less than 10 degrees. In further some such embodiments, theta$_1$ and theta$_2$ are both less than 10 degrees but greater than 5 degrees.

In other embodiments, theta$_1$ may be substantially 0 and theta$_2$ can be less than 20 degrees, when $T_2$ is less than 10 nm. In some such embodiments, theta$_1$ can be greater than or less than theta$_2$. Sloped sidewalls 234A cause the lateral thickness, $W_{FED}$, of etched ferroelectric dielectric layer 234 to be wider than lateral thickness, $W_{TE}$ of top electrode 232.

The ferroelectric dielectric layer 234 sidewalls 234A that extend beyond sidewalls 232A of the top electrode 232.

Figure 3B:
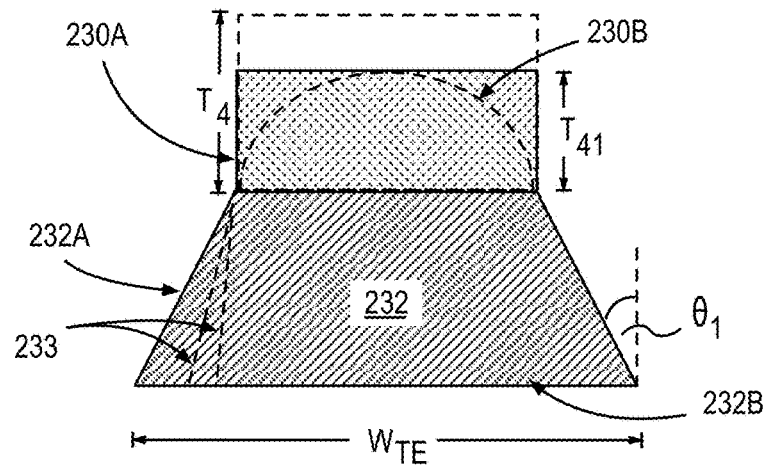
FIG. 3B is a cross-sectional illustration of a patterned portion of the material layer stack.

It is to be appreciated that in some embodiments, the hardmask 230 may be further eroded during the etching process utilized to etched ferroelectric dielectric layer 234. The thickness, $T_{42}$ of hardmask 230 may be less than $T_{41}$ (described in association with FIG. 3B.) In an embodiment, the top of hardmask 230 may be rounded as discussed earlier.

Referring again to FIG. 4A, because the material of the conductive layer 208 is same or substantially the same as the material of the top electrode 232, it is to be appreciated that preservation of hardmask 230 is important to prevent loss of top electrode 232 during etching the conductive layer 208. Preservation of hardmask 230 may require a lower plasma bias etch process while forming etched ferroelectric dielectric layer 234. This can cause a flare in the lower portion of the etched ferroelectric dielectric layer 234 as indicated by dashed lines 237. In some embodiments, the flare may be removed with continued etching.

Figure 5A:
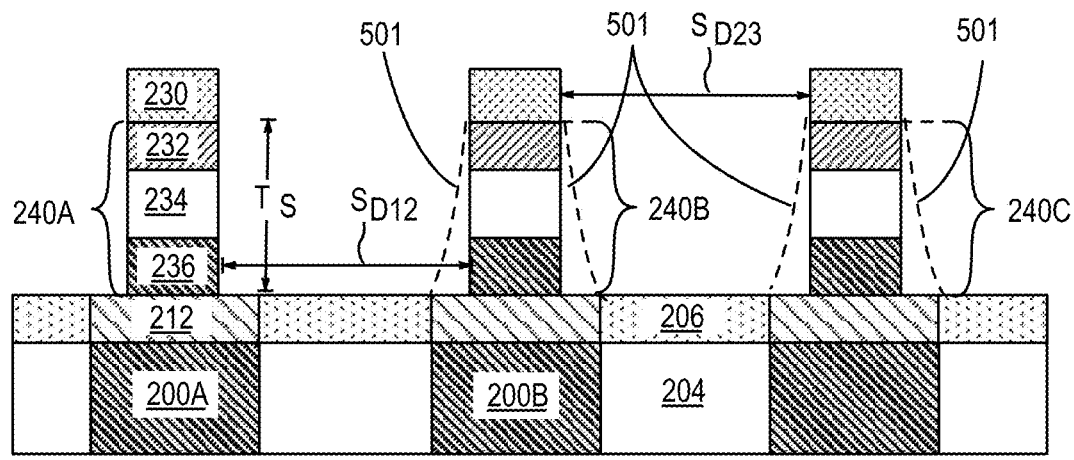
FIG. 5A is a cross-sectional illustration of the structure in FIG. 4A following the process to pattern a bottom conductive layer in the material layer stack.

FIG. 5A is a cross-sectional illustration of the structure in FIG. 4A following the process to pattern and form a bottom electrode 236. In an embodiment, the process utilized to etch conductive layer 208 (FIG. 4A) to form bottom electrode 236 may be substantially the same as the etch process utilized to form top electrode 232. The process of forming the top electrode 232, ferroelectric dielectric layer 234, bottom electrode 236 also completes formation of FeRAM devices 240A, 240B and 240C.

In an exemplary embodiment, bottom electrode 236 is plasma etched to have substantially vertical sidewalls 236A, as shown. In some such embodiments, hardmask 230 is also substantially preserved through the etch process. As shown, devices 240A and 240B, for example are separated by a lateral spacing $S_{D12}$, and devices 240B and 240C are separated by lateral spacing $S_{D23}$. In exemplary embodiments, $S_{D12}$, is substantially the same as $S_{D23}$. The height of the FeRAM devices 240A, 240B and 240C is $H_{FD}$. In embodiments, the ratio of height to spacing, $H_{FD}$: $S_{D12}$ or $S_{D23}$ is between 1:2 to 5:1. It is to be appreciated that $S_{D12}$ or $S_{D23}$ is a function of the sidewall profiles of each of the layers 232, 234 and 236 in the FeRAM devices 240A, 240B and 240C. $S_{D12}$, and $S_{D23}$ are substantially uniform when sidewall profiles of FeRAM devices 240A, 240B and 240C are substantially vertical. In embodiments where sidewalls of FeRAM devices 240A, 240B and 240C are not vertical, as indicated by dashed lines 501, $S_{D12}$, and $S_{D23}$ is decreased compared to when sidewalls of FeRAM devices 240A, 240B and 240C are substantially vertical.

Figure 5B:
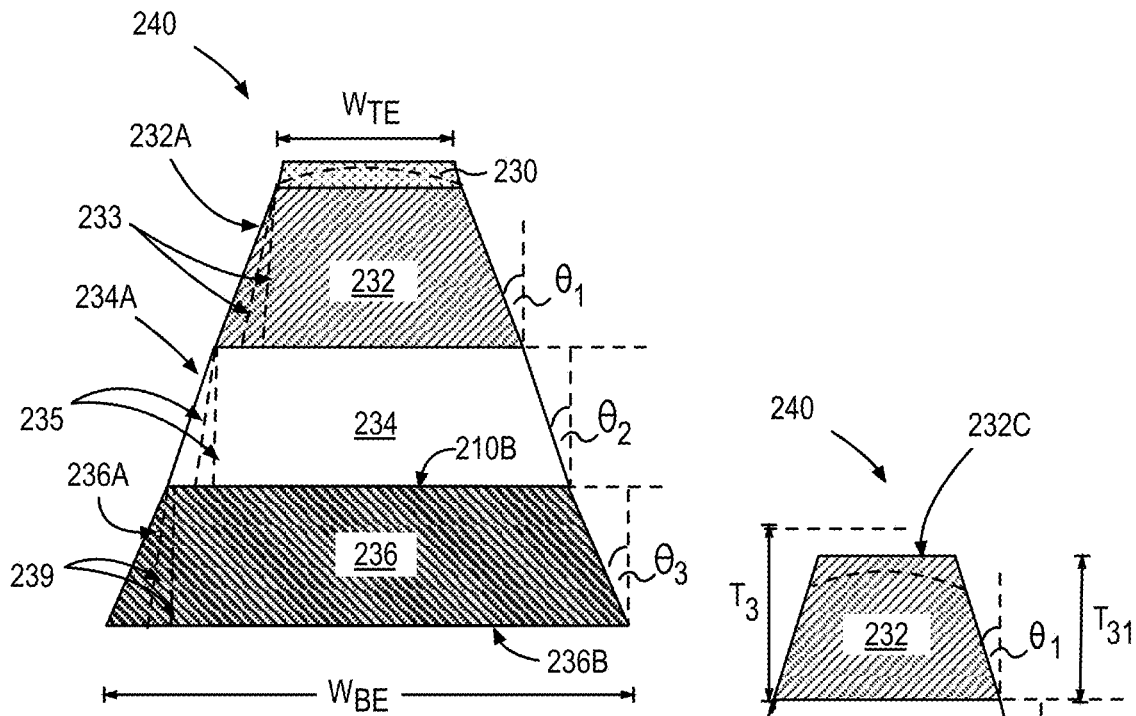
FIG. 5B is a cross-sectional illustration of a patterned portion of the material layer stack, in accordance with an embodiment of the present disclosure.

FIG. 5B is an enhanced cross-sectional illustration of a patterned portion of a FeRAM device in accordance with an embodiment of the present disclosure. In some embodiments, the sidewalls 236A of the bottom electrode are sloped as illustrated. In embodiments, the slope can vary between 0 degrees to 30 degrees from a normal relative to lower surface 236B. The slope may be defined by an angle $theta_3$.

In general, maximum allowable $theta_1$, $theta_2$ and $theta_3$, i.e., $theta_{1max}$, $theta_{2max}$ and $theta_{3max}$, are set by ratio, $R_{HS}$, between thickness $T_S$, and spacing $S_{D12}$ or $S_{D13}$ (as shown in FIG. 5A). For example, $T_S$ can be between 7 nm and 90 nm, while $S_{D12}$ or $S_{D13}$ can be between 20 nm-50 nm. When $R_{HS}$ is 1:1 or less, $theta_1$, $theta_2$ and $theta_3$, can be up to 30 nm. However, for $R_{HS}$ greater than 1:1 it is desirable to minimize the total flare or increase in width of FeRAM devices 240A, 240B or 240C. Additional reasons for minimizing flare is to provide space between any two adjacent FeRAM devices 240A, 240B or 240C to fabricate an encapsulation layer on sidewalls of the FeRAM devices 240A, 240B or 240C.

In exemplary embodiments, $theta_{3max}$ is between 0 and 10 degrees when $T_1$ is less than 30 nm and $T_2$ is less than 10 nm, and $T_3$ is less than 30 nm. As indicated by dotted lines 239, variations in the slope of sidewall 236A can change the lateral thickness, $W_{BE}$, of lowermost surface 236B. It is to be appreciated that that sidewalls 232A, 234A and 236A can have same or different slopes. In some embodiments, $theta_1$, $theta_2$, and $theta_3$ are substantially the same and sidewalls 232A, 234A, 236A are substantially collinear. In some such embodiments, $theta_1$, $theta_2$ and $theta_3$ are each less than 10 degrees. In further some such embodiments, $theta_1$, $theta_2$ and $theta_3$ are each less than 10 degrees but greater than 5 degrees. In some embodiments, $theta_1 < theta_2 < theta_3$, where each theta1, theta2, $theta_3$ remain less than 10 degrees. In other embodiments, $theta_1$ may be substantially close to 0, $theta_2$ can be between 10 and 30 degrees, and $theta_3$ can be less than 10 degrees. In yet other embodiments, $theta_1$ is substantially close to 0 degrees, $theta_2$ is less than 30 degrees, and $theta_3$ is substantially close to 0. In yet other embodiments, $theta_1$ is substantially close to 0 degrees, $theta_2$ is less than 30 degrees, and $theta_3$ is substantially close to 0 degrees, where $theta_1$, $theta_2$ and $theta_3$ are different from each other. In some embodiments, $theta_1$ is substantially less than 10 degrees, $theta_2$ is substantially close to 0 and $theta_3$ is substantially less than 10 degrees. In various embodiments, by scaling down $T_S$ from 90 nm, an average flare of the FeRAM device 240 can be increased, for example up to 30 degrees. An average flare is defined as a sum of different theta angles divided by three.

Regardless of the difference between $theta_1$, $theta_2$ or $theta_3$, in exemplary embodiments sidewall of FeRAM device 240 do not have staircase sidewall profile, where for example an uppermost surface of bottom electrode 236 is wider than a lowermost surface of ferroelectric dielectric layer 234.

Sloped sidewalls 236A cause the lateral thickness, $W_{BE}$, of the bottom electrode 236 to be wider than lateral thickness, $W_{TE}$ of an uppermost surface of top electrode 232. In the illustrative embodiment, the bottom electrode 236 extends beyond sidewalls 234A of the ferroelectric dielectric layer 234.

It is to be appreciated that in some embodiments, the hardmask 230 may be further eroded during the etching process utilized to form bottom electrode 236. In an embodiment, the top of hardmask 230 may be rounded as discussed earlier.

Figure 5C:
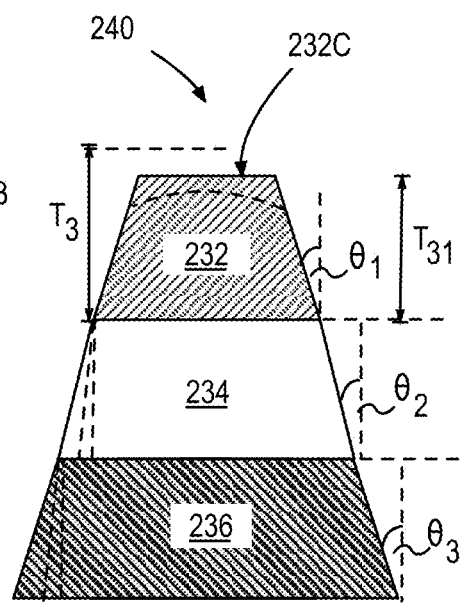
FIG. 5C is a cross-sectional illustration of a patterned portion of the material layer stack, in accordance with an embodiment of the present disclosure.

FIG. 5C is an enhanced cross-sectional illustration of a FeRAM device 240, in accordance with an embodiment of the present disclosure. As shown, in one process embodiment the hardmask 230 is completely removed. In some such embodiment, top portion of top electrode 232 is etched reducing the height of top electrode 232 to $T_{31}$. A reduction in height may result while patterning the bottom electrode because of the same or substantially same materials of the top electrode 232 and the bottom electrode 236. Thus, deposition of a conductive layer having a thickness greater than $T_3$ is highly desirable to maintain a minimum desired thickness of the top electrode 232 post completion of all etch operations required to fabricate FeRAM device 240. Also as shown, in one embodiment, a top surface 232C of the top electrode 232 may be rounded due to the plasma etch.

Figure 7A:
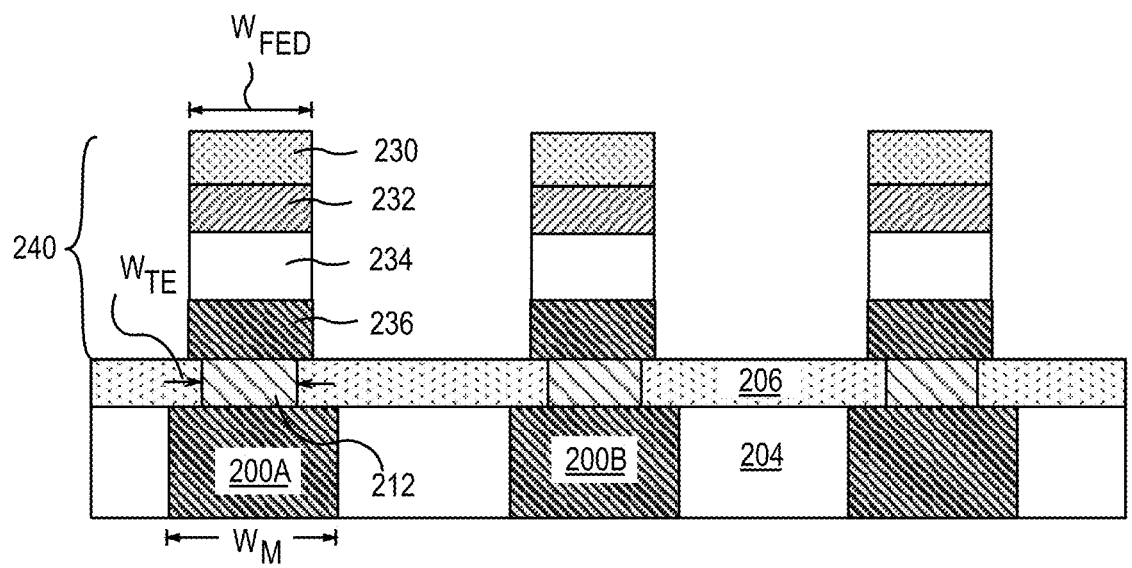
FIG. 7A is a cross-sectional illustration of the structure in FIG. 5A where the transition electrode has is narrower than a FeRAM device or a metallization structure, in accordance with an embodiment of the present disclosure.
Figure 7B:
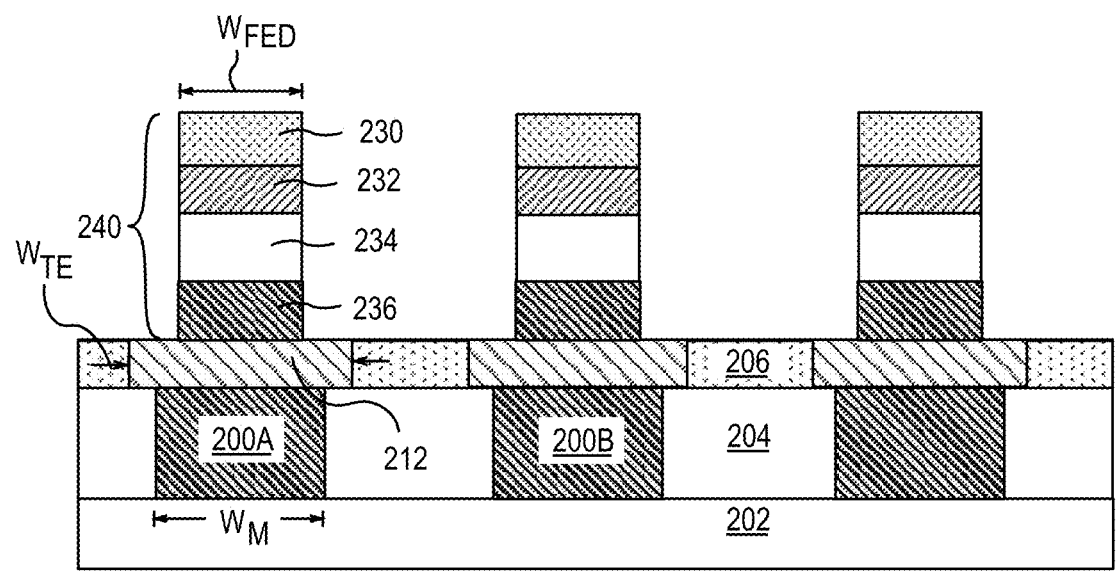
FIG. 7B is a cross-sectional illustration of the structure in FIG. 5A where the transition electrode has is wide than a FeRAM device or a metallization structure, in accordance with an embodiment of the present disclosure.

As shown in FIG. 5A, the transition electrode 212 has a lateral thickness that is substantially the same as a lateral thickness of the metallization structure 200A. In other embodiments, the transition electrode 212 has a lateral thickness, $W_{TE}$, that is less than $W_M$ or a lateral thickness, $W_{FED}$, of the FeRAM device 240 as shown in FIG. 7A. $W_{FED}$ may be measured at the base of the FeRAM device 240.

In some embodiments, the transition electrode 212 has a lateral thickness, $W_{TE}$, that is greater than $W_M$ or a lateral thickness, $W_{FED}$, of the FeRAM device 240 as shown in FIG. 7A. A greater later thickness of transition electrode 212 can prevent over etch of the encapsulation layer 206 and exposure of underlying material of the metallization structure 200A, 200B or 200C, during patterning of the bottom electrode 236.

Figure 6A:
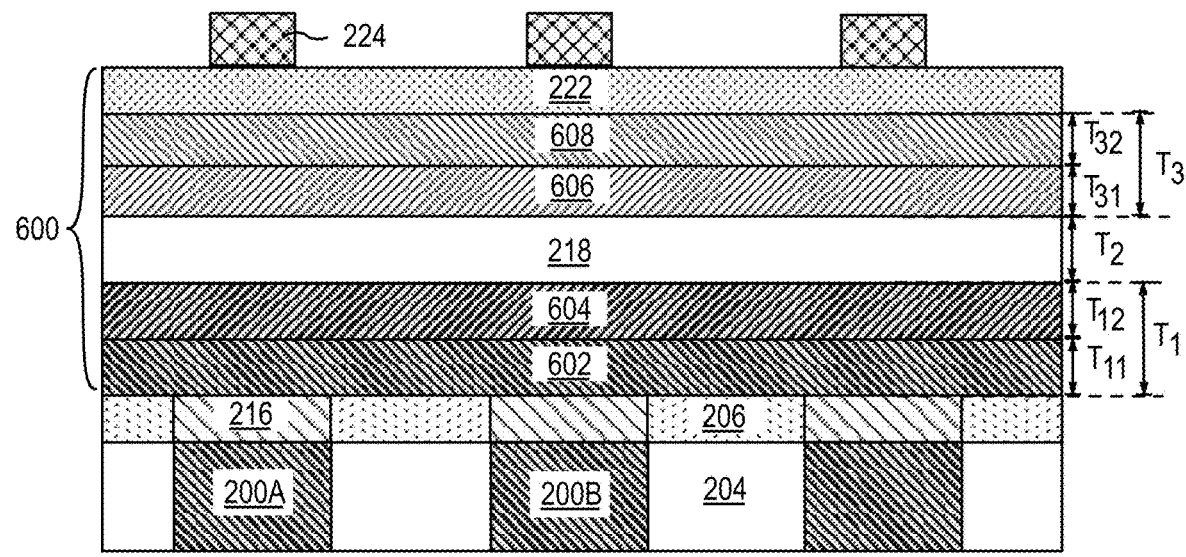
FIG. 6A is a cross-sectional illustration of the structure in FIG. 2C following the process to form a material layer stack on the transition electrode, in accordance with an embodiment of the present disclosure.

FIG. 6A is a cross-sectional illustration of the structure in FIG. 2C following the process to form a material layer stack 600 on the transition electrode 212, in accordance with an embodiment of the present disclosure. As shown, material layer stack 600 includes two layers of lower conductive layers 602 and 604 on layer 602, a ferroelectric dielectric layer 218 on the lower conductive layer 604, and two layers of upper conductive layers 606 and 608. In an exemplary embodiment, material layer stack 600 is symmetric about the ferroelectric dielectric layer 218. Thus, lower conductive layer 602 includes a same material or substantially the same material as the upper conductive layer 608. Similarly, lower conductive layer 604 includes a same material or substantially the same material as the upper conductive layer 606. In an embodiment, the lower conductive layer 604 and the upper conductive layer 606 each include a material that is the same or substantially the same as the material of the conductive layer 216. In some such embodiments, the lower conductive layers 604 and 606 include materials that are different from each other. In an embodiment, the upper conductive layers 606 and 608 each include a material that is the same or substantially the same as the material of the conductive layer 220. In some such embodiments, the upper conductive layers 606 and 608 each include materials that are different from each other.

It is to be appreciated that the total thickness of the material layer stack 600 may be substantially the same as the thickness of the material layer stack 214. In some embodiments, the combined thickness, $T_3$, of the upper conductive layers 606 and 608 may be substantially the same as single conductive layer $T_3$ of the conductive layer 220 (described in association with FIG. 2D). Similarly in some embodiments, the combined thickness, $T_1$, of the lower conductive layers 602 and 604 may be substantially the same as single conductive layer $T_1$ of the conductive layer 216 (described in association with FIG. 2D). Furthermore, individual thicknesses, $T_{11}$ and $T_{12}$ of lower conductive layers 602 and 604, respectively may be the same or different. Similarly individual thicknesses, $T_{31}$ and $T_{32}$ of upper conductive layers 606 and 608, respectively, may be the same or different. It is to be appreciated that the individual thickness of the upper conductive layers 606 and 608 and that of the lower conductive layers 602 and 604, need not be symmetric. For example, $T_{32}$, may be 10 times greater than, $T_{31}$ and $T_{11}$ may be 10 times greater than $T_{12}$. Materials and thicknesses of the stacks of conductive layers may be chosen to facilitate device functionality and accommodate thicknesses of one or more structures that may be prevalent over the substrate in adjacent regions (for example, interconnect structures that are present over logic circuitry present in layers adjacent to and below the metallization structures 200.

Figure 6B:
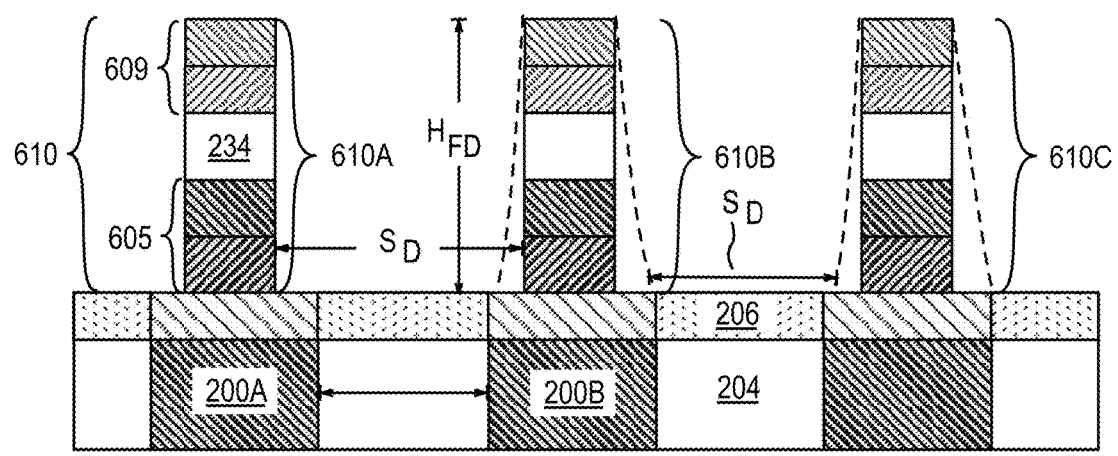
FIG. 6B is a cross-sectional illustration of the structure in FIG. 6A following the process to pattern the material layer stack to form a plurality of FeRAM devices, in accordance with an embodiment of the present disclosure.

FIG. 6B is a cross-sectional illustration of the structure in FIG. 6A following the process to pattern the material layer stack to form a plurality of FeRAM devices 610 in accordance with an embodiment of the present disclosure. In the illustrative embodiment, a plasma etch process utilized to fabricate the plurality of FeRAM devices 610 results in substantially vertical sidewalls of individual ferroelectric layers within the plurality of FeRAM devices 610 (hardmask is omitted for clarity). In the illustrative embodiment, the upper and the lower conductive layers are etched to form top electrode 609 and bottom electrode 605, respectively.

As discussed above, the ratio of lateral height, $H_{FD}$, of individual devices 610A, 610B and 610C in the plurality of FeRAM devices 610 to spacing, $S_D$, between any two directly adjacent FeRAM devices 610A and 610B, or 610B and 610C is between 1:2 to 5:1. In embodiments, where sidewalls of the FeRAM devices 610A, 610B and 610C are tapered (to a greater lateral width at the bottom as indicated by the dashed lines 615), the ratio between height $H_{FD}$ and spacing, $S_D$, between adjacent FeRAM devices 610A and 610B, or 610B and 610C also decreases depending on an amount of taper.

Figure 6C:
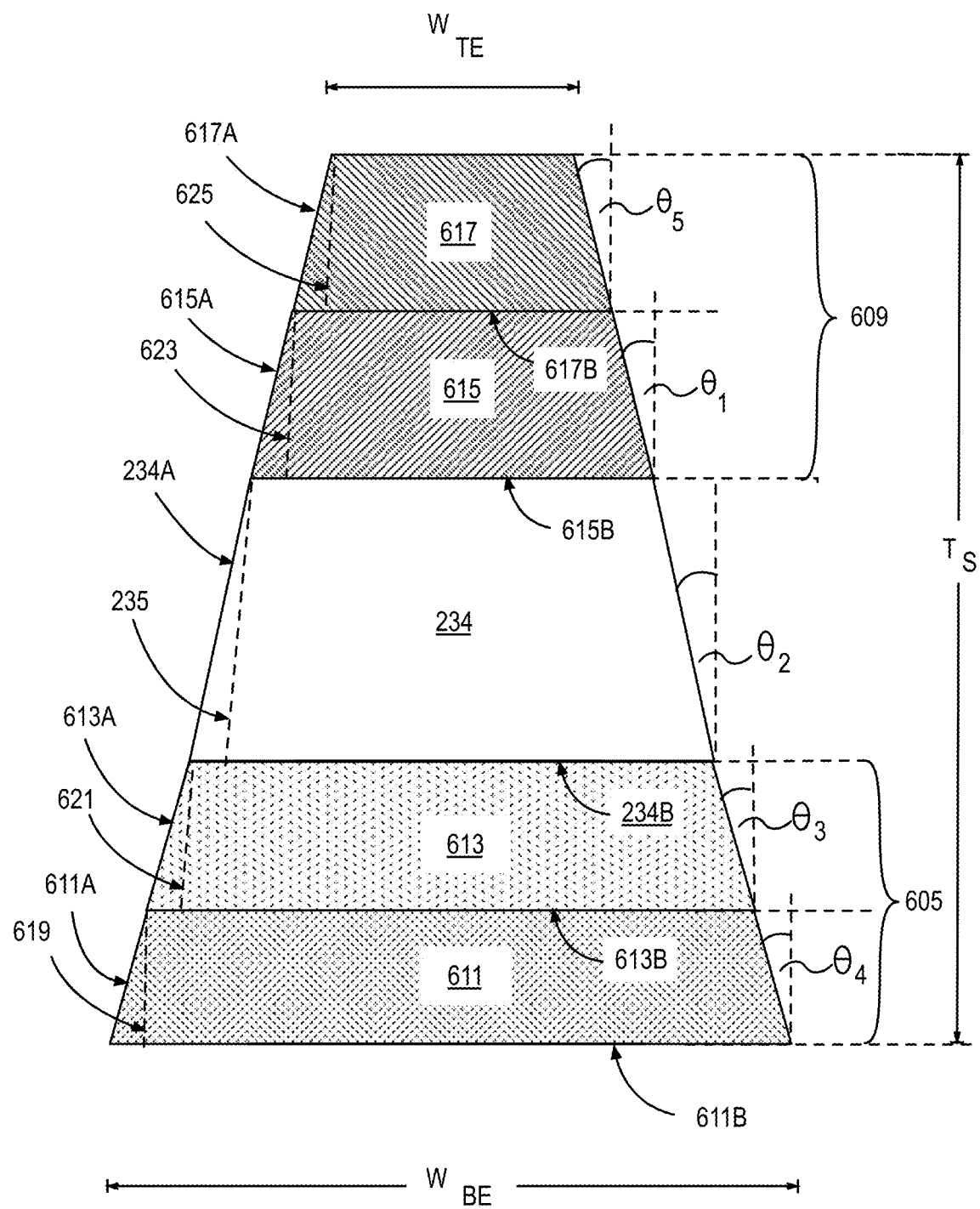
FIG. 6C is an enhanced cross-sectional illustration of layers in FeRAM device where individual layers can have varying slopes.

FIG. 6C is an enhanced cross-sectional illustration of layers in FeRAM device where individual layers can have varying slopes. The plasma etch process forms top electrode 609 that includes top electrode layer 615 and top electrode layer 617 on top electrode layer 615. The plasma etch process forms bottom electrode 605 that includes bottom electrode layer 611 and bottom electrode layer 613 on bottom electrode layer 611. Layers 611, 613, 615 and 617 include one or more properties of the sidewalls of the top electrode 232 and bottom electrode 236, respectively (as described in association with FIGS. 4B and 5B). In the illustrative embodiment, sidewalls 611A of the bottom electrode layer 611 are sloped as illustrated. In embodiments, the slope can vary between 0 degrees to 30 degrees from a normal relative to lower surface 611B. The slope may be defined by an angle $theta_4$. As indicated by dotted lines 619, variations in the slope of sidewall 611A can change the lateral thickness, $W_{BE}$, of lowermost surface 611B.

In an embodiment, sidewalls 613A of the bottom electrode layer 613 are sloped as illustrated. In embodiments, the slope can vary between 0 degrees to 30 degrees from a normal relative to lower surface 611B. The slope may be defined by an angle $theta_3$. As indicated by dotted lines 621, variations in the slope of sidewall 613A can change the lateral thickness of lowermost surface 613B.

In an embodiment, sidewalls 615A of the top electrode layer 615 are sloped as illustrated. In embodiments, the slope can vary between 0 degrees to 30 degrees from a normal relative to lower surface 615B. The slope may be defined by an angle $theta_1$. As indicated by dotted lines 623, variations in the slope of sidewall 615A can change the lateral thickness of lowermost surface 615B.

In an embodiment, sidewalls 617A of the top electrode layer 617 are sloped as illustrated. In embodiments, the slope can vary between 0 degrees to 30 degrees from a normal relative to lower surface 617B. The slope may be defined by an angle $theta_5$. As indicated by dotted lines 625, variations in the slope of sidewall 617A can change the lateral thickness of lowermost surface 617B.

It is to be appreciated that that sidewalls 617A, 615A, 234A, 613A and 611A can have same or different slopes. In some embodiments, $theta_1$, $theta_2$, $theta_3$, $theta_4$, and $theta_5$ are substantially the same and sidewalls 617A, 615A, 234A, 613A and 611A are substantially collinear. However, while 617A, 615A, 234A, 613A and 611A can be substantially collinear, a maximum $theta_1$, $theta_2$, $theta_3$, $theta_4$, and $theta_5$ will depend on a total thickness, $T_S$. In some examples, where $R_{HS}$ is greater than 1:1, maximum $theta_1$, $theta_2$, theta$_3$, theta$_4$, and theta$_5$ will each be less than 10 degrees. In some examples, where R$_{HS}$ is smaller than 1:1, maximum theta$_1$, theta$_2$, theta$_3$, theta$_4$, and theta$_5$ can be each be as much as 30 degrees. Differences in angles, theta$_1$, theta$_2$, theta$_3$, theta$_4$, and theta$_5$ are a result of an impact of plasma etch on different materials and different thicknesses of each material.

Figure 8:
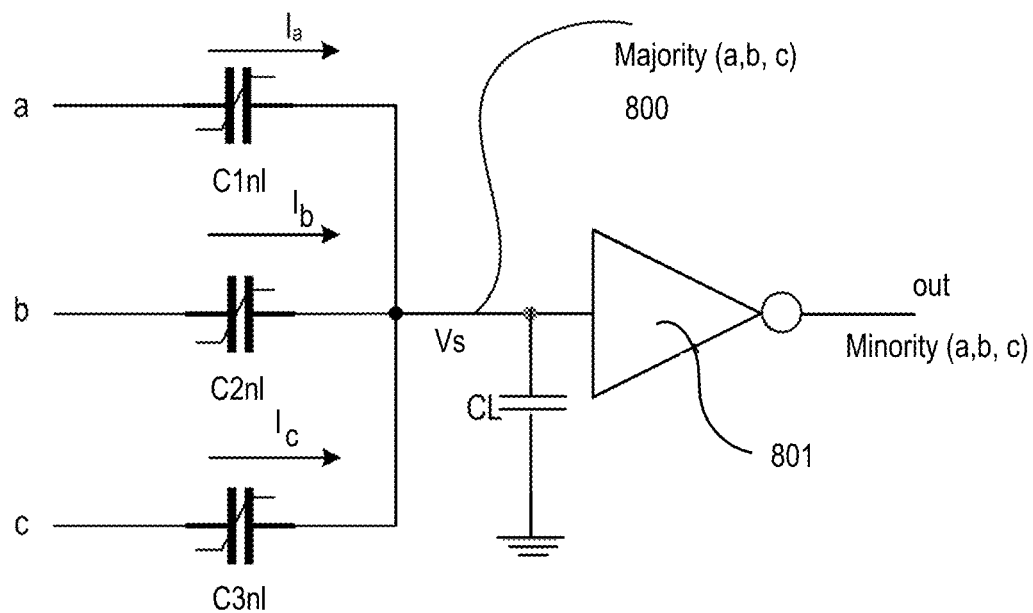
FIG. 8 illustrates a 3-input majority gate using non-linear input capacitors, in accordance with some embodiments.

FIG. 8 illustrates 3-input majority gate 800 using non-linear input capacitors, in accordance with some embodiments. In some embodiments, 3-input majority gate 800 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 800 comprises a driver circuitry 801. In this example, driver circuitry 801 is an inverter. In other embodiments, other types of driver circuitries can be used such as NAND gate, NOR gate, multiplexer, buffer, and other logic gates. The majority function is performed at summing node Vs as Majority (a,b,c). In this example, since driver 801 is an inverter, minority function is performed at output "out" as Minority (a,b,c).

In some embodiments, in addition to the gate capacitance of driver circuitry 801, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfOX, ABO3 perovskites, nitrides, oxy-fluorides, oxides, etc. A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O.

In various embodiments, the FE material can be any suitable low voltage FE material that allows the FE material to switch its state by a low voltage (e.g., 100 mV). In some embodiments, the FE material comprises a perovskite of the type ABO$_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a FE (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFcO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFcO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO) or BFO with doping material.

In some embodiments, the FE material includes Bismuth ferrite (BFO), BFO with a doping material where in the doping material is one of Lanthanum, or any element from the lanthanide series of the periodic table. In some embodiments, the FE material includes a relaxor ferroelectric including one of Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1-xEx Oy where E can be Al, Ca, Ce, Dy, er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node Vs produces a voltage and current that is the output of the majority gate 800. Any suitable driver 801 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

The majority function is performed at the summing node Vs, and the resulting voltage is projected on to capacitance of driver circuitry 801. For example, the majority function of the currents ($I_a$, $I_b$, and $I_c$) on node Vs results in a resultant current that charges capacitor 105. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 800. Any suitable driver 801 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 4 illustrates a 3-input majority gate, the same concept can be extended to more than 3 inputs to make an N-input majority gate, where N is greater than 2. In various embodiments, 'N' is an odd number. For example, a 5-input majority gate is similar to an input majority gate 800 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 801 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$$

where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\wedge$), one for each of the $2^n$ possible combinations of 0 and 1 for $C_1, C_2, \ldots C_n$. The second level of logic is represented by a single OR gate ($\vee$). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 9:
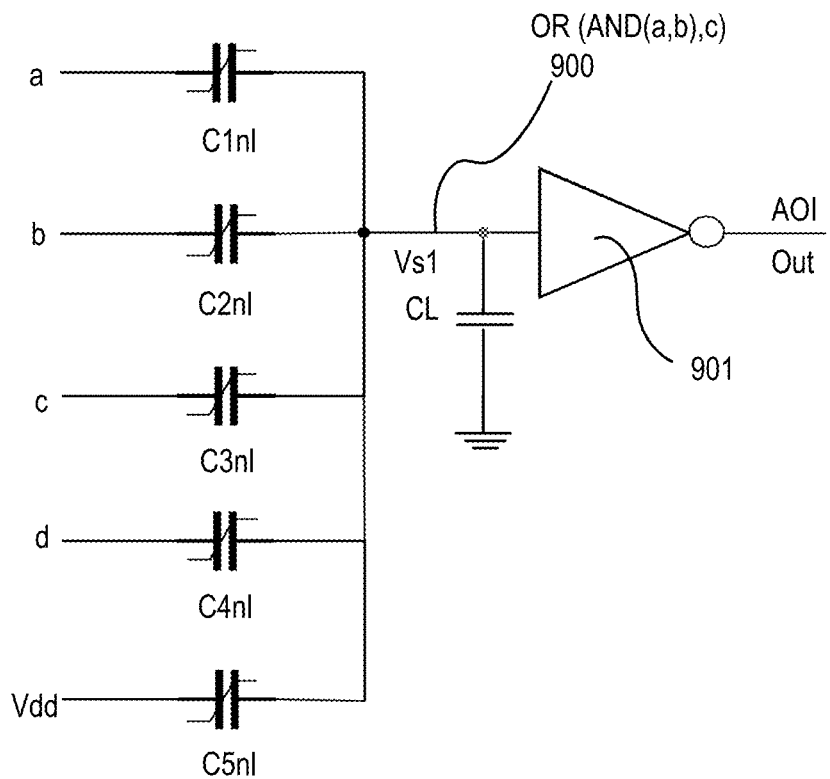
FIG. 9 illustrates a complex logic gate implemented using a 5-input majority gate, in accordance with some embodiments.

FIG. 9 illustrates complex logic gate 900 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 901 coupled as shown. In various embodiments, two of the non-linear capacitors receives the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

Figure 10:
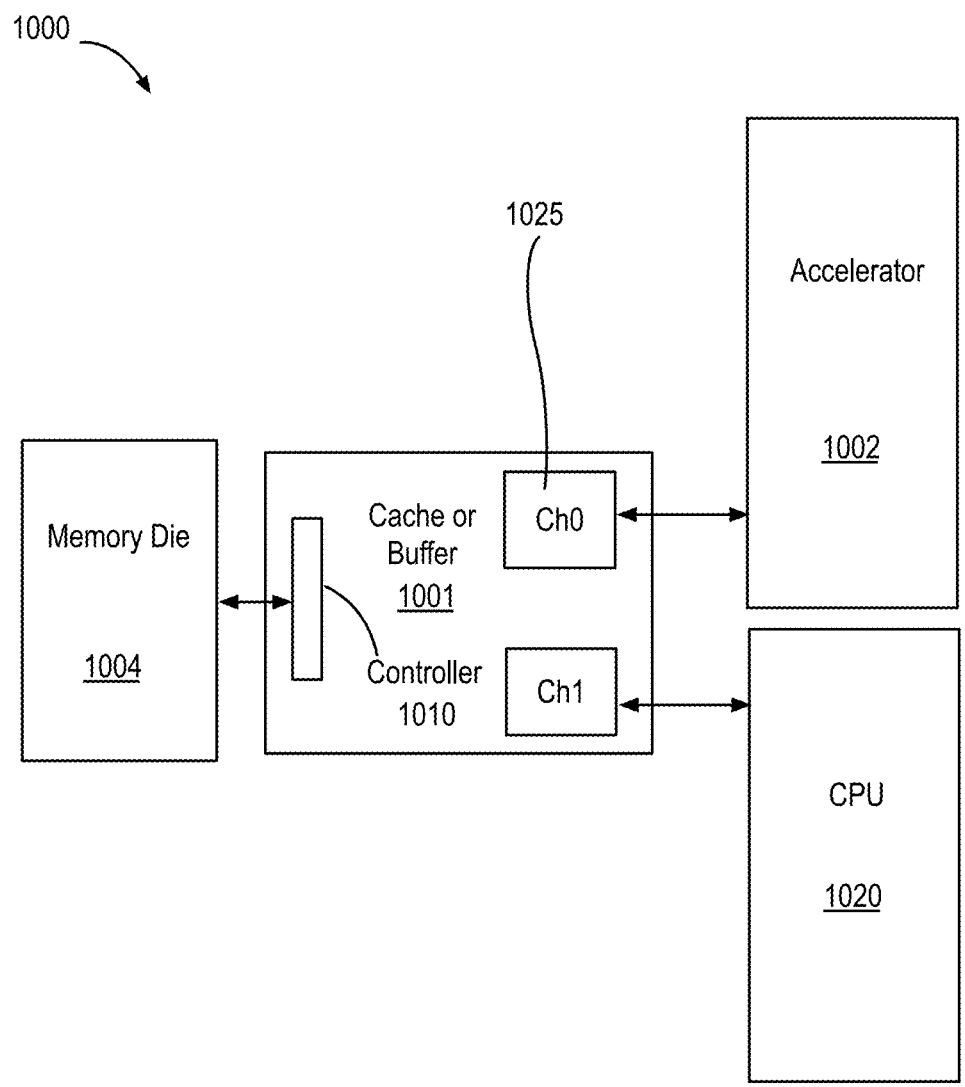
FIG. 10 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 10 illustrates computing architecture 1000 with a coherent cache or memory-side buffer chiplet that includes a memory controller, wherein the coherent cache or memory-side buffer chiplet is coupled to an accelerator, a processor, and a memory, in accordance with some embodiments. Computing architecture 1000 comprises coherent cache or memory-side buffer chiplet 1001, accelerator 1002 (e.g., inference chip), processor (e.g., central processing unit 1020), and memory die 2004. In some embodiments, coherent cache or memory-side buffer chiplet 1001 comprises at least two channels 1015 which are configured to connect with accelerator 1002 and processor 1020. In some embodiments, coherent cache or memory-side buffer chiplet 1001 comprises I/O and controller 1010 to manage data traffic with memory die 2004. By moving controller 1010 from processor 1020 to coherent cache or memory-side buffer chiplet 1001, cost in terms of power and die area for processor 1020 is reduced. In some embodiments, coherent cache or memory-side buffer chiplet 1001 is a cache memory that comprises ferroelectric memory cells. For example, coherent cache or memory-side buffer chiplet 1001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 11:
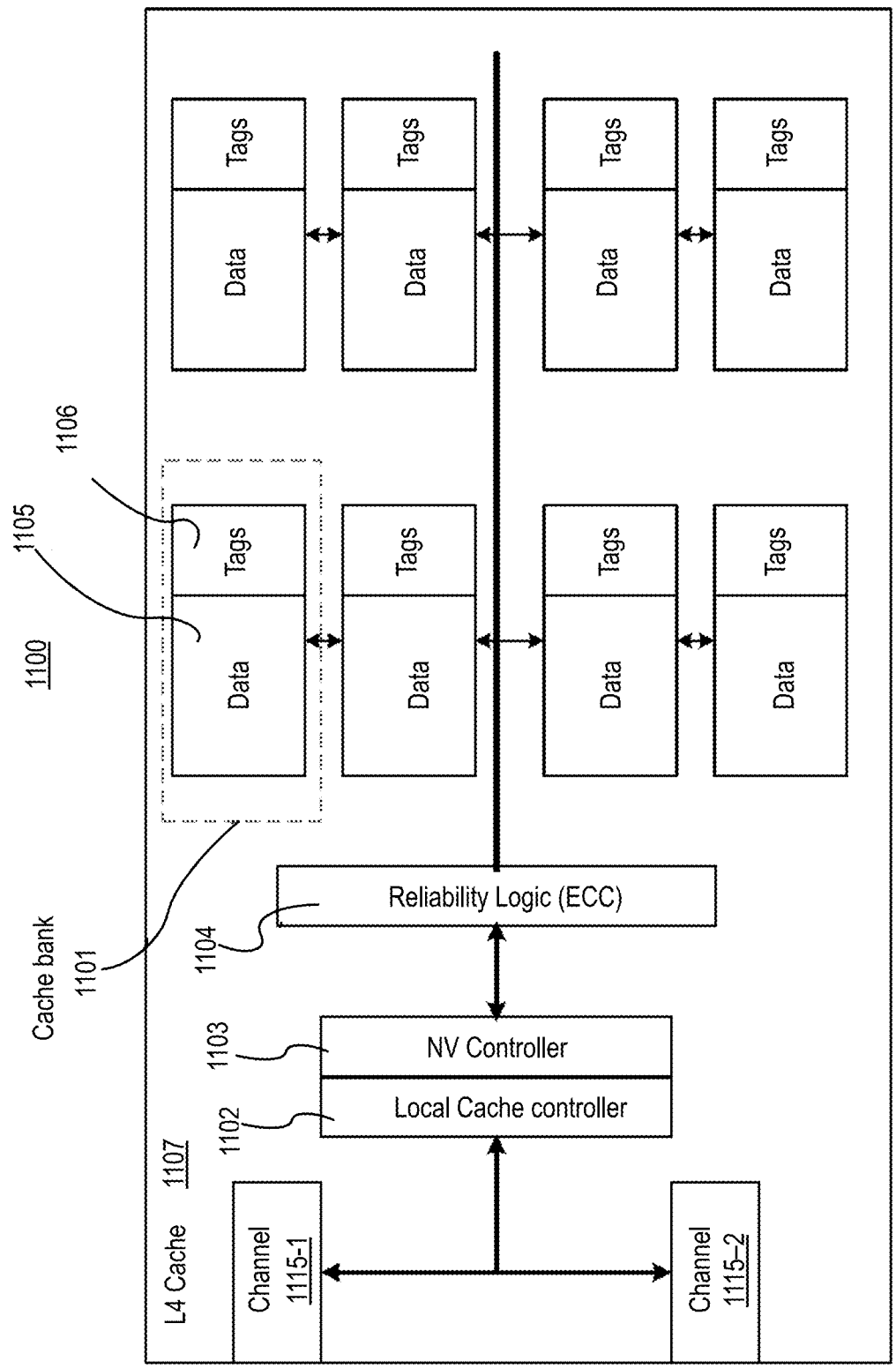
FIG. 11 illustrates an architecture of the coherent cache or memory-side buffer chiplet with multiple controllers and multiple cache banks, in accordance with some embodiments.

FIG. 11 illustrates architecture 1100 of the coherent cache or memory-side buffer chiplet (e.g., 1107) with multiple controllers and multiple cache banks, in accordance with some embodiments. In some embodiments, architecture 1100 comprises channels (e.g., ch0 1115-1 and ch1 1115-2), cache banks 1101, local cache controller 1102, non-volatile (NV) controller 1103, and reliability logic 1104. Coherent cache or memory-side buffer chiplet 1107 may function as a cache or memory buffer. In some embodiments, cache lookups can map a large physical memory into a small physical cache through the use of indirection via tags. Here, indirection refers to the use of tags to specify which address maps to which physical location. If multiple addresses can map to a single physical location, a tag is used to figure out which address is currently mapped.

In some embodiments, each cache bank 1101 includes data bank 1105 (e.g., comprising memory cells) and associated tags 1106. In some embodiments, data bank 1105 comprises ferroelectric memory cells. In some embodiments, data bank 1105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 1105 includes ferroelectric memory, it uses NV controller 1103 and a stronger reliability logic (e.g., error correction code) for security compared to non-ferroelectric memory for data bank 1105.

When data region 1105 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 1106 may be coupled with each physical line. Tag 1106 may comprise some address bits, sufficient to uniquely identify which address currently occupies the physical line coupled with the tag.

In some embodiments, cache controller 1102 could be used to control state transitions required for cache look ups such as comparing requested addresses with tags stored in the tag array 1106, and identifying a candidate for replacement (replacement algorithm) when a cache miss occurs. In addition, the cache controller could be tasked with initializing the cache when the cache powers on. When FE memory of data region 1105, which retains state across power cycles, is used, cache controller 1102 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 1102 would skip locations marked thus when initializing memory.

In some embodiments, reliability logic 1104 performs error correction to the data. Any suitable error correction scheme (e.g., with error correction code (ECC)) may be used by reliability logic 1104. In some embodiments, NV controller 1103 is provided to explicitly clear the cache when using a non-volatile memory, such as FM memory for data region 1105. NV controller 1103 may include an NV bit which indicates cache lines that should not be cleared but are expected to retain their contents across power cycles. The functions of NV controller 1103 can be combined in cache controller 1102, or vice versa.

Figure 12:
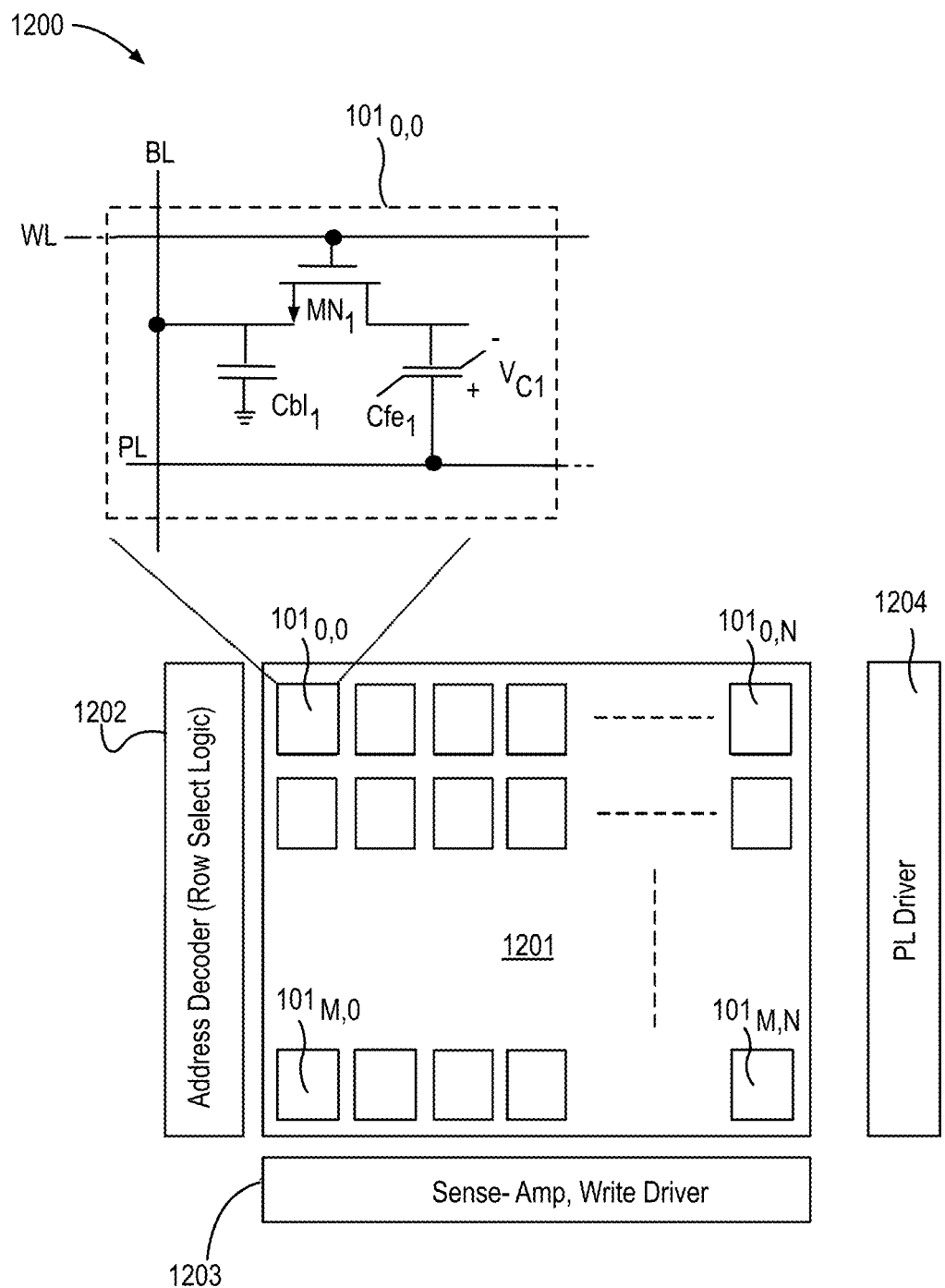
FIG. 12 illustrates an apparatus comprising memory and corresponding logic, wherein the memory comprises ferroelectric (FE) memory bit-cells, in accordance with some embodiments.

FIG. 12 illustrates apparatus 1200 comprising memory and corresponding logic, wherein the memory comprises ferroelectric (FE) memory bit-cells, in accordance with some embodiments. Apparatus 1200 comprises M×N memory array 1201 of bit-cells, logic circuitry 1202 for address decoding, sense amplifier and write drivers 1203, and plate-line (PL) driver 1204. Logic 1202 comprises address decoders for selecting a row of bit-cells and/or a particular bit-cell from M×N array 1201, where M and N are integers of same or different values. Logic 1203 comprises sense-amplifiers for reading the values from the selected bit-cell, while write drivers are used to write a particular value to a selected bit-cell. Here, a schematic of FE bit-cell 1201$_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell 1201$_{0,0}$ comprises a word-line (WL), a plate-line (PL), a bit-line (BL), a complementary bit-line (BLB), and two half bit-cells 1201$_{0,0\_A}$ and 1201$_{0,0\_B}$. In some embodiments, bit-cell 1201$_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CB1_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 13:
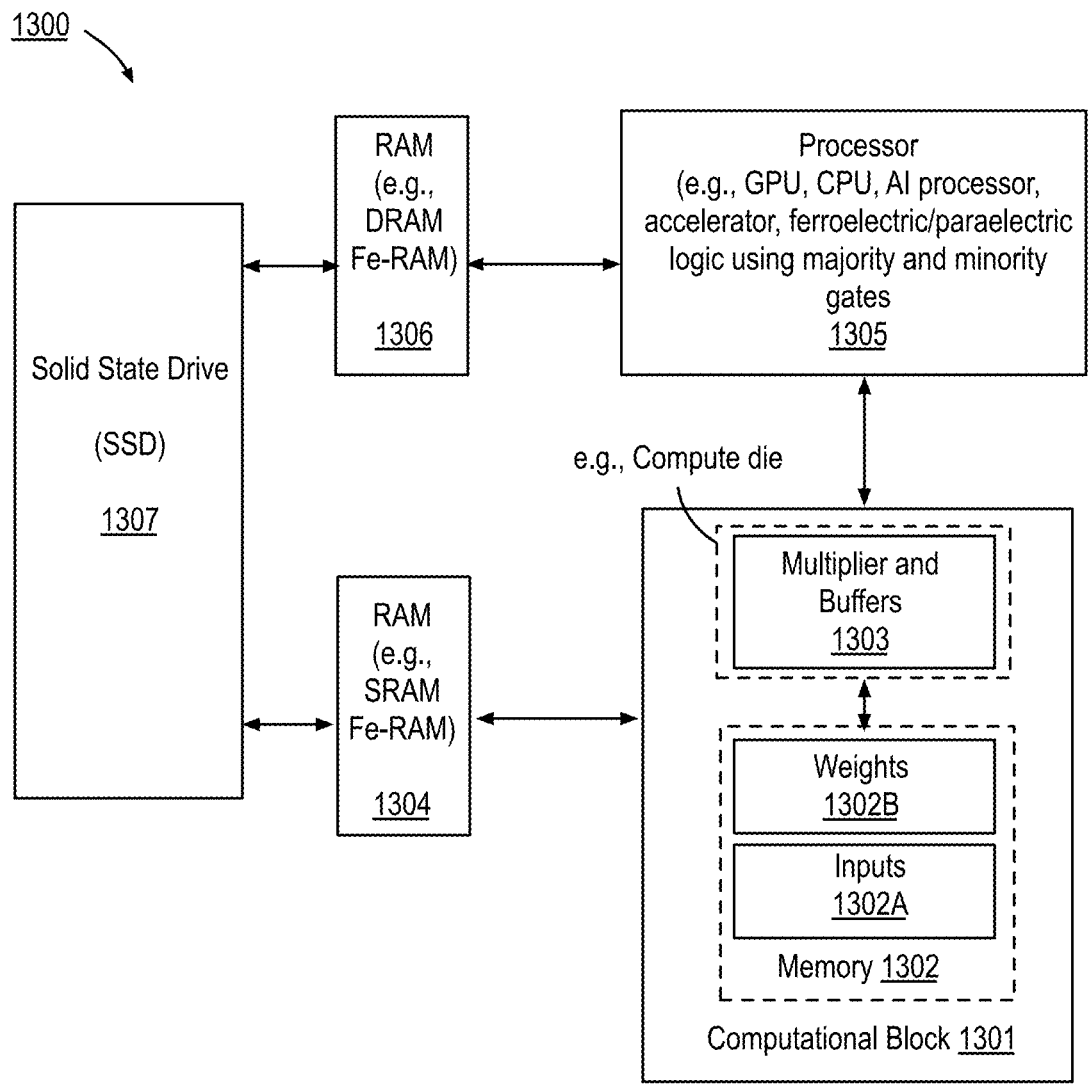
FIG. 13 illustrates a high-level architecture of an artificial intelligence (AI) machine comprising a compute die positioned on top of a memory die, in accordance with some embodiments.

FIG. 13 illustrates a high-level architecture of an artificial intelligence (AI) machine 1300 comprising a compute die positioned on top of a memory die, in accordance with some embodiments. AI machine 1300 comprises computational block 1301 or processor having random-access memory (RAM) 1302 and computational logic 1303; first random-access memory 1304 (e.g., static RAM (SRAM), ferroelectric or paraelectric RAM (FeRAM), ferroelectric or paraelectric static random-access memory (FeSRAM)), main processor 1305, second random-access memory 1306 (dynamic RAM (DRAM), FeRAM), and solid-state memory or drive (SSD) 1307. In some embodiments, some or all components of AI machine 1300 are packaged in a single package forming a system-on-chip (SoC). The SoC can be configured as a logic-on-logic configuration, which can be in a 3D configuration or a 2.5D configuration.

In some embodiments, computational block 1301 is packaged in a single package and then coupled to processor 1305 and memories 1304, 1306, and 1307 on a printed circuit board (PCB). In some embodiments, computational block 1301 is configured as a logic-on-logic configuration, which can be in a 3D configuration or a 2.5D configuration. In some embodiments, computational block 1301 comprises a special purpose compute die 1303 or microprocessor. For example, compute die 1303 is a compute chiplet that performs a function of an accelerator or inference. In some embodiments, memory 1302 is DRAM which forms a special memory/cache for the special purpose compute die 1303. The DRAM can be embedded DRAM (eDRAM) such as 1T-1C (one transistor and one capacitor) based memories. In some embodiments, RAM 1302 is ferroelectric or paraelectric RAM (Fe-RAM).

In some embodiments, compute die 1303 is specialized for applications such as Artificial Intelligence, graph processing, and algorithms for data processing. In some embodiments, compute die 1303 further has logic computational blocks, for example, for multipliers and buffers, a special data memory block (e.g., buffers) comprising DRAM, FeRAM, or a combination of them. In some embodiments, RAM 1302 has weights and inputs stored in-order to improve the computational efficiency. The interconnects between processor 1305 (also referred to as special purpose processor), first RAM 1304 and compute die 1303 are optimized for high bandwidth and low latency. The architecture of FIG. 13 allows efficient packaging to lower the energy, power, or cost and provides for ultra-high bandwidth between RAM 1302 and compute chiplet 1303 of computational 1301.

In some embodiments, RAM 1302 is partitioned to store input data (or data to be processed) 1302a and weight factors 1302b. In some embodiments, input data 1302a is stored in a separate memory (e.g., a separate memory die) and weight factors 1302b are stored in a separate memory (e.g., separate memory die).

In some embodiments, computational logic or compute chiplet 1303 comprises matrix multiplier, adder, concatenation logic, buffers, and combinational logic. In various embodiments, compute chiplet 1303 performs multiplication operation on inputs 1302a and weights 1302b. In some embodiments, weights 1302b are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1302b. In various embodiments, the input data, that is to be analyzed using a trained model, is processed by computational block 1301 with computed weights 1302*b* to generate an output (e.g., a classification result).

In some embodiments, first RAM 1304 is ferroelectric or paraelectric based SRAM. For example, a six transistor (6T) SRAM bit-cells having ferroelectric or paraelectric transistors are used to implement a non-volatile FeSRAM. In some embodiments, SSD 1307 comprises NAND flash cells. In some embodiments, SSD 1307 comprises NOR flash cells. In some embodiments, SSD 1307 comprises multi-threshold NAND flash cells.

In various embodiments, the non-volatility of FeRAM is used to introduce new features such as security, functional safety, and faster reboot time of architecture 1300. The non-volatile FeRAM is a low power RAM that provides fast access to data and weights. FeRAM 1304 can also serve as a fast storage for inference die 1301 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 1300 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFcO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: (La,Sr)CoO3, SrRuO3, (La,Sr)MnO3, YBa2Cu3O7, Bi2Sr2CaCu2O8, LaNiO3, etc. may be used for FE material 213. Perovskites can be suitably doped to achieve a spontaneous distortion in a range of 0.3 to 2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: Bismuth ferrite (BFO), or BFO with doping material.

In some embodiments, the FE material includes Bismuth ferrite (BFO), BFO with a doping material where in the doping material is one of Lanthanum, or any element from the lanthanide series of the periodic table. In some embodiments, the FE material includes a relaxor ferro-electric includes one of Barium Titanium-Bismuth Zinc Niobium Tantalum (BT-BZNT) or Barium Titanium-Barium Strontium Titanium (BT-BST).

In some embodiments, the FE material includes Hafnium oxides of the form, Hf1-x Ex Oy where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFcO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 1300. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O.

The method of forming the structures described herein are applicable to various logic embodiments. For example, the FeRAM devices or capacitive structures formed herein can be used to forming other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Example 1: A method of fabricating a device, the method comprising: forming a multilayer stack, the forming comprising: depositing a first conductive layer comprising a non-Pb based perovskite metal oxide; depositing a ferroelectric dielectric layer comprising a non-Pb based perovskite material on the first conductive layer; depositing a second conductive layer comprising non-Pb based perovskite metal oxide on the ferroelectric dielectric layer; and forming a mask on the multilayer stack; and patterning the multilayer stack to form a device by applying a plasma etch process, the plasma etch process comprising: etching the second conductive layer to form a top electrode comprising a sidewall, the sidewall comprising a first angle; etching the ferroelectric dielectric layer to form an etched ferroelectric dielectric layer comprising a sidewall, the sidewall comprising a second sidewall angle; and etching the first conductive layer to form a bottom electrode comprising a sidewall, the sidewall comprising a third sidewall angle, wherein the etched ferroelectric dielectric is between the top electrode and the bottom electrode.

Example 2: The method of example 1, wherein the plasma etch process comprises a magnetically enhanced reactive ion etching process, an electron cyclotron discharge process or an inductively coupled plasma etch process.

Example 3: The method of example 2, wherein the plasma etch process comprises a plasma density between 1e9-1e12 particles/cm^3.

Example 4: The method of example 1, wherein the non-Pb based perovskite metal oxide comprises La—Sr—CoO3, SrRuO3, La—Sr—MnO3, YBa2Cu3O7, Bi2Sr2CaCu2O8, or LaNiO3 and the ferroelectric dielectric layer comprises oxygen and two or more of La, Sr, Co, Cr, K, Nb, Na, Sr, Ru, Y, Fe, Ba, Hf, Zr, Cu, Ta, Bi, Ca, Ti or Ni.

Example 5: The method of example 1, wherein the first angle, the second angle and the third angle are measured relative to a normal to lowermost surface of the respective first electrode, etched dielectric layer and the third electrode.

Example 6: The method of example 5, wherein the first angle is formed to be less than the second angle and the second angle is formed to be less than the third angle.

Example 7: The method of example 5, wherein the first angle, the second angle and the third angle are formed to be substantially the same.

Example 8: The method of example 7, wherein the first angle, the second angle and the third angle are formed to be substantially vertical or wherein the first angle, the second angle and the third angle are formed to be substantially non vertical.

Example 9: The method of example 5, wherein the first angle, and the third angle are formed to be substantially the same and the second angle is formed to be greater than the first or the third angles.

Example 10: The method of example 9, wherein the first angle and the third angle are formed to be between 80 and 90 degrees.

Example 11: The method of example 1, wherein the device is a first device in an array of devices, wherein a second device is simultaneously formed in the array of devices by patterning the multilayer stack, wherein the second device is laterally separated from the first device by a first spacing and wherein the first device and the second device each comprise a same height.

Example 12: The method of example 1, wherein patterning the second device forms respective sidewalls having the respective first, second and third angles that are non-vertical, wherein the respective slope is measured relative to a normal to a lowermost surface of the first electrode.

Example 13: The method of example 13, wherein the plasma etch forms respective sidewalls of the first device and the second device comprising first, second and third angles that are each between 0 degrees and 30 degrees.

Example 14: The method of example 1, wherein the plasma etch process erodes the second conductive layer to form the top electrode comprising a non-planar top surface.

Example 15: A device structure comprising: a plurality of memory devices laterally spaced apart, wherein individual ones of the plurality of memory devices comprise: a first conductive layer comprising a non-Pb based perovskite metal oxide, the first conductive layer comprising a first sidewall having a first slope; a ferroelectric dielectric layer comprising a non-Pb based perovskite material on the first conductive layer, the ferroelectric dielectric layer comprising a second sidewall having a second slope; and a second conductive layer comprising non-Pb based perovskite metal oxide on the ferroelectric dielectric layer, the second conductive layer comprising a third sidewall having a third slope, wherein the respective first, second and third slopes are less than or equal to ninety degrees relative to a lowermost surface of the first conductive layer.

Example 16: The device structure of example 15, wherein a first device in the plurality of memory devices, is laterally separated from a second device in the plurality of memory devices by a first spacing and wherein the first device and the second device each comprise a same height.

Example 17: A method of fabricating a memory device, the method comprising: forming a multilayer stack, the forming comprising: depositing a first conductive layer comprising a first non-Pb based perovskite metal oxide above a substrate; depositing a second conductive layer comprising a second non-Pb based perovskite metal oxide above a substrate; depositing a ferroelectric dielectric layer comprising a non-Pb based perovskite material on the first conductive layer; depositing a third conductive layer comprising non-Pb based perovskite metal oxide on the ferroelectric dielectric layer; and forming a mask on the multilayer stack; and patterning the multilayer stack to form a memory device by applying a plasma etch process, the plasma etch process comprising: etching the fourth conductive layer to form a first top electrode comprising a first sidewall, the first sidewall comprising a first angle; etching the third conductive layer to form a second top electrode comprising a second sidewall, the second sidewall comprising a second angle; etching the ferroelectric dielectric layer to form an etched ferroelectric dielectric layer comprising a third sidewall, the third sidewall comprising a third sidewall angle; etching the second conductive layer to form a first bottom electrode comprising a fourth sidewall, the fourth sidewall comprising a fourth sidewall angle; and etching the first conductive layer to form a second bottom electrode comprising a fifth sidewall, the fifth sidewall comprising a fifth sidewall angle, wherein the etched ferroelectric dielectric is between the second top electrode and the first bottom electrode.

Example 18: The method of example 17, wherein the device is a first device in an array of devices, wherein a second device is simultaneously formed in the array of devices by patterning the multilayer stack, wherein the second device is laterally separated from the first device by a first spacing and wherein the first device and the second device each comprise a same height.

Example 19: The method of example 17, wherein patterning the second device forms respective sidewalls having the respective first, second, third, fourth and fifth angles that are non-vertical, wherein the respective slope is measured relative to a normal to a lowermost surface of the first electrode.

Example 20: The method of example 17, wherein the plasma etch forms respective sidewalls of the first device and the second device comprising first, second, third, fourth and fifth angles that are each between 0 degrees and 30 degrees.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A device structure comprising:
   a plurality of memory devices laterally spaced apart, wherein individual ones of the plurality of memory devices comprise:
   a first conductive layer comprising a first non-Pb based perovskite metal oxide, the first conductive layer comprising a first sidewall having a first slope;
   a dielectric layer comprising a non-Pb based perovskite material on the first conductive layer, the dielectric layer comprising a second sidewall having a second slope; and
   a second conductive layer comprising a second non-Pb based perovskite metal oxide on the dielectric layer, the second conductive layer comprising a third sidewall having a third slope, wherein the first slope, the second slope, and the third slope are measured relative to a normal to a lowermost surface of the first conductive layer, wherein the first slope comprises a first angle, the second slope comprises a second angle and the third slope comprises a third angle, wherein the third angle is less than the second angle, and wherein the second angle is less than the first angle, and wherein the first slope, the second slope, and the third slope are each greater than or equal to zero degrees.

2. The device structure of claim 1, wherein the first angle and the third angle are between 0 and 10 degrees.

3. The device structure of claim 1, wherein the first angle, the second angle, and the third angle are each between 0 degrees and 30 degrees.

4. The device structure of claim 1, wherein a first device in the plurality of memory devices is laterally separated from a second device in the plurality of memory devices by a spacing, and wherein the first device and the second device each comprise a same height, and wherein a ratio of height to spacing ranges between 1:2 and 5:1.

5. The device structure of claim 1, wherein the first non-Pb based perovskite metal oxide comprises one of: La—Sr—CoO$_3$, SrRuO$_3$, La—Sr—MnO$_3$, YBa$_2$Cu$_3$O$_7$, Bi$_2$Sr$_2$CaCu$_2$O$_8$, or LaNiO and wherein the second non-Pb based perovskite metal oxide comprises one of: La—Sr—CoO$_3$, SrRuO$_3$, La—Sr—MnO$_3$, YBa$_2$Cu$_3$O$_7$, Bi$_2$Sr$_2$CaCu$_2$O$_8$, or LaNiO$_3$.

6. The device structure of claim 1, wherein the dielectric layer comprises one of:
   a perovskite material which includes one of: BaTiO$_3$, KNbO$_3$, or NaTaO$_3$;
   bismuth ferrite (BFO), or BFO doped with an element from 3d, 4d, 5d, 6d, 4f, or 5f series of periodic table;
   a relaxor ferroelectric material which includes one of: barium titanium-bismuth zinc niobium tantalum (BT-BZNT), or barium titanium-barium strontium titanium (BT-BST);
   a first hexagonal ferroelectric which includes one of: YMnO$_3$ or LuFeO$_3$;
   a second hexagonal ferroelectric of a type h-RMnO$_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxide of a form $Hf_{1-x}E_xO_z$, where 'x' denotes a fraction, and E includes one of Al, Ca, Ce, Dy, Er, Gd, Ge, La, Sc, Si, Sr, Sn, Zr, or Y;

$ABO_3$ niobate type compounds including $LiNbO_3$, $LiTaO_3$, $LiTaO_2F_2$, $Sr_xBa_{1-x}Nb_2O_6$ where $0.32 \leq x \leq 0.8$, or $KSr_2Nb_5O_{15}$; or an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100.

7. The device structure of claim 1, further comprising:
a third conductive layer below the first conductive layer, the third conductive layer comprising a fourth sidewall, the fourth sidewall comprising a fourth angle; and
a fourth conductive layer above the second conductive layer, the fourth conductive layer comprising a fifth sidewall, the fifth sidewall comprising a fifth angle, wherein the third conductive layer comprises one of: La—Sr—$CoO_3$, $SrRuO_3$, La—Sr—$MnO_3$, $YBa_2Cu_3O_7$, $Bi_2Sr_2CaCu_2O_8$, or $LaNiO_3$, and wherein the fourth conductive layer comprises one of: La—Sr—$CoO_3$, $SrRuO_3$, La—Sr—$MnO_3$, $YBa_2Cu_3O_7$, $Bi_2Sr_2CaCu_2O_8$, or $LaNiO_3$.

8. The device structure of claim 7, wherein the first angle, the second angle, the third angle, the fourth angle, and the fifth angle are each between 0 degrees and 30 degrees.

9. The device structure of claim 7, wherein the fourth sidewall and the fifth sidewall are collinear.

10. A device structure comprising:
a plurality of memory devices laterally spaced apart, wherein individual ones of the plurality of memory devices comprise:
a first conductive layer comprising a non-Pb based perovskite metal oxide, the first conductive layer comprising a first sidewall having a first slope;
a dielectric layer comprising a non-linear polar material having a form $ABB'O_3$, wherein B' is a dopant for atomic site B, wherein O is oxygen, wherein the dielectric layer is on the first conductive layer, and wherein the dielectric layer comprises a second sidewall having a second slope; and
a second conductive layer comprising a second non-Pb based perovskite metal oxide on the dielectric layer, the second conductive layer comprising a third sidewall having a third slope, wherein the first slope, the second slope, and the third slope are measured relative to a normal to lowermost surface of the first conductive layer, wherein the first slope comprises a first angle, the second slope comprises a second angle and the third slope comprises a third angle, wherein the third angle is less than the second angle, and wherein the second angle is less than the first angle, and wherein the first slope, the second slope, and the third slope are each greater than or equal to zero degrees.

11. The device structure of claim 10, wherein a first device in the plurality of memory devices is laterally separated from a second device in the plurality of memory devices by a spacing, wherein the first device and the second device each comprise a substantially equal height, wherein a ratio of height to the spacing is 1:1 or less, and wherein the height is between 7 nm and 90 nm, and wherein the spacing is between 20 nm and 50 nm.

12. The device structure of claim 10, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Zr, Al, Hf, Mn, Fe, Ta, or Nb, and wherein "B" includes one of: Sc, Ti, V, Cr, Mn, Fe, Co, Ni, Cu, or Zn.

13. A device structure comprising:
a transistor comprising:
a source;
a gate; and
a drain; and
a memory device coupled with the drain of the transistor, the memory device comprising:
a bottom electrode comprising a first non-Pb based perovskite metal oxide, the bottom electrode comprising a first sidewall having a first slope;
a dielectric layer comprising a non-linear polar material having a form $ABB'O_3$, $AA'B'O_3$, or $ABO_3$, wherein A' is a first dopant for atomic site A, wherein B' is a second dopant for atomic site B, wherein O is oxygen, wherein the dielectric layer is on the bottom electrode, and wherein the dielectric layer comprises a second sidewall having a second slope; and
a top electrode comprising a second non-Pb based perovskite metal oxide on the dielectric layer, the bottom electrode comprising a third sidewall having a third slope, wherein the first slope, the second slope, and the third slope are measured relative to a normal to a lowermost surface of the bottom electrode, wherein the first slope comprises a first angle, the second slope comprises a second angle and the third slope comprises a third angle, wherein the third angle is less than the second angle, and wherein the second angle is less than the first angle, and wherein the first slope, the second slope, and the third slope are each greater than or equal to zero degrees.

14. The device structure of claim 13, wherein the bottom electrode comprises a thickness that is less than 30 nm and the third slope is less than 10 degrees, wherein the dielectric layer comprises a first thickness of less than 10 nm, and wherein the top electrode comprises a second thickness of less than 30 nm.

15. The device structure of claim 13, wherein the non-linear polar material has the form $ABB'O_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B" includes one of: Sc, Ti, V, Cr, Mn, Fe, Co, Ni, Cu, or Zn.

16. The device structure of claim 13, wherein the non-linear polar material has the form $ABO_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, and wherein "B" includes one of Mn, Fe, Ta, or Nb.

17. The device structure of claim 13, wherein the non-linear polar material has the form $AA'BO_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, wherein "A" includes one of Y, La, Sc, Ce, Pr, Nd, Pm, Sm, Eu, Gd, Tb, Dy, Ho, Er, T, Yb, Lu, and wherein A' comprises a valency of site A, but different ferroelectric polarizability from A.

18. The device structure of claim 7, wherein the first sidewall and the fourth sidewall are collinear and wherein the third sidewall and fifth sidewall are collinear.

19. The device structure of claim 7, wherein the first angle and the fourth angle are each less than 10 degrees, and wherein the third angle and the fifth angle are each zero degrees.

20. The device structure of claim 7, wherein the first conductive layer comprises a first thickness, the second conductive layer comprises a second thickness, the third conductive layer comprises a third thickness and the fourth conductive layer comprises a fourth thickness, wherein the third thickness is ten times greater than the first thickness, and wherein the fourth thickness is ten times greater than the second thickness.

\* \* \* \* \*